(12) United States Patent
Yamazaki et al.

(10) Patent No.: US 6,387,737 B1
(45) Date of Patent: May 14, 2002

(54) SEMICONDUCTOR DEVICE AND MANUFACTURING METHOD THEREOF

(75) Inventors: Shunpei Yamazaki, Tokyo; Hideaki Kuwabara; Yasuyuki Arai, both of Kanagawa, all of (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 09/566,735

(22) Filed: May 9, 2000

(30) Foreign Application Priority Data

Mar. 8, 2000 (JP) ........................................ 2000-064227

(51) Int. Cl.[7] .............................................. H01L 21/00
(52) U.S. Cl. ........................................ 438/149; 257/59
(58) Field of Search ................................ 438/149, 153, 438/30; 257/59, 347–353

(56) References Cited

U.S. PATENT DOCUMENTS

| | | | |
|---|---|---|---|
| 5,151,806 A | 9/1992 | Kawamoto et al. | 359/59 |
| 5,362,660 A | 11/1994 | Kwasnick et al. | 437/40 |
| 5,478,766 A | 12/1995 | Park et al. | 437/40 |
| 5,532,180 A | 7/1996 | den Boer et al. | 437/40 |
| 5,539,219 A * | 7/1996 | den Boer et al. | 257/72 |
| 5,668,379 A | 9/1997 | Ono et al. | 257/59 |
| 5,706,064 A | 1/1998 | Fukunaga et al. | 349/43 |
| 5,739,880 A | 4/1998 | Suzuki et al. | 349/110 |
| 5,757,453 A | 5/1998 | Shin et al. | 349/122 |
| 5,811,318 A | 9/1998 | Kweon | 438/30 |
| 5,917,567 A | 6/1999 | Oh et al. | 349/113 |
| 5,966,189 A | 10/1999 | Matsuo | 349/38 |
| 5,986,724 A | 11/1999 | Akiyama et al. | 349/41 |
| 5,990,998 A * | 11/1999 | Park et al. | 349/139 |
| 5,995,190 A | 11/1999 | Nagae et al. | 349/156 |
| 5,998,229 A | 12/1999 | Lyu et al. | 438/30 |
| 6,008,869 A | 12/1999 | Oana et al. | 349/43 |
| 6,064,456 A | 5/2000 | Taniguchi et al. | 349/113 |
| 6,075,257 A | 6/2000 | Song | 257/59 |
| 6,097,458 A | 8/2000 | Tsuda et al. | 349/113 |
| 6,097,459 A | 8/2000 | Shimada et al. | 349/113 |
| 6,114,184 A | 9/2000 | Matsumoto et al. | 438/30 |
| 6,124,606 A | 9/2000 | den Boer et al. | 257/291 |
| 6,188,452 B1 | 3/2001 | Kim et al. | 349/43 |
| 6,197,625 B1 | 3/2001 | Choi | 438/158 |
| 6,208,390 B1 | 3/2001 | Ejiri et al. | 349/43 |
| 6,208,395 B1 | 3/2001 | Kanoh et al. | 349/113 |
| 6,218,221 B1 | 4/2001 | Sah | 438/158 |
| 6,255,668 B1 * | 7/2001 | Kang et al. | 257/59 |
| 6,266,117 B1 | 7/2001 | Yanagawa et al. | 349/141 |

FOREIGN PATENT DOCUMENTS

| | | |
|---|---|---|
| JP | 05-323371 | 12/1993 |
| JP | 09-015621 | 1/1997 |
| JP | 9-54318 | 2/1997 |
| JP | 09-152626 | 6/1997 |
| JP | 11-258596 | 9/1999 |

OTHER PUBLICATIONS

Wolf et al., "Silicon Processing for the VLSI Era", pp. 161–175 and 335, 1986, Lattice Press vol. 1 Process Technology.

Wolf et al., "Silicon Processing for the VLSI Era", pp. 161–175, 1986, Lattice Press vol. 1 Process Technology.

* cited by examiner

*Primary Examiner*—David Nelms
*Assistant Examiner*—Quoc Hoang
(74) *Attorney, Agent, or Firm*—Eric J. Robinson; Nixon Peabody LLP

(57) ABSTRACT

A TFT is manufactured using at least five photomasks in a conventional liquid crystal display device, and therefore the manufacturing cost is high.

By performing the formation of the pixel electrode 127, the source region 123 and the drain region 124 by using three photomasks in three photolithography steps, a liquid crystal display device prepared with a pixel TFT portion, having a reverse stagger type n-channel TFT, and a storage capacitor can be realized.

59 Claims, 17 Drawing Sheets

[FIG. 1]
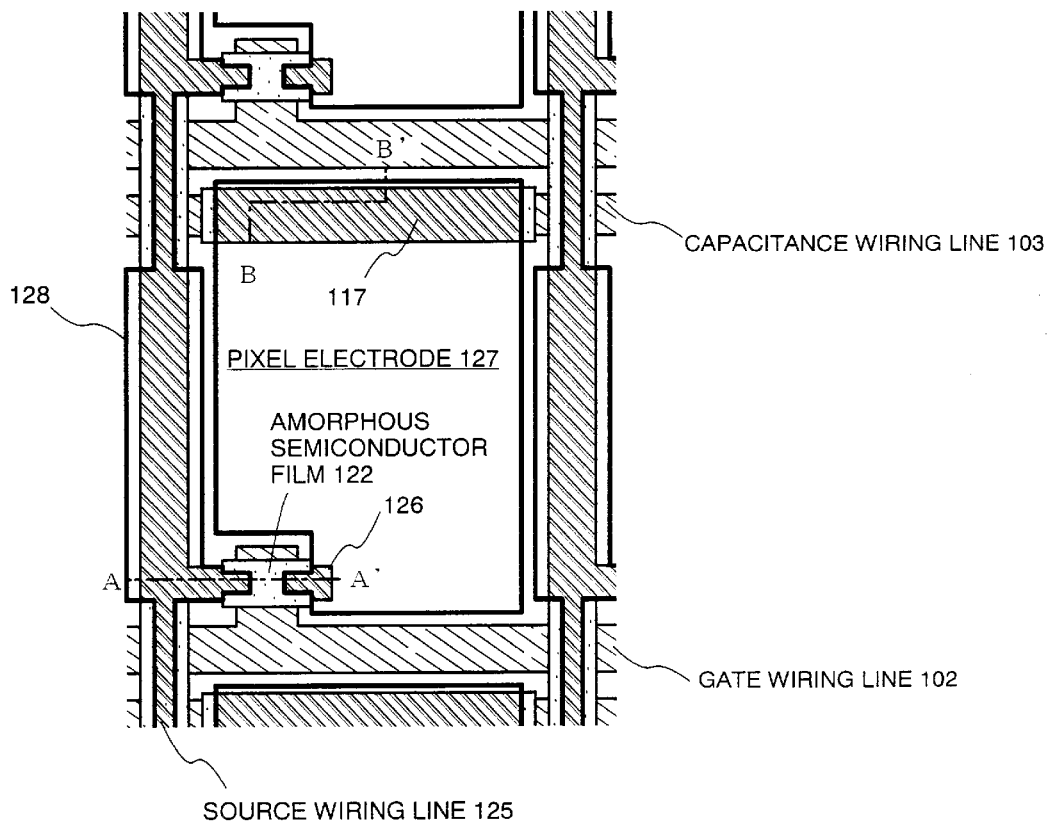

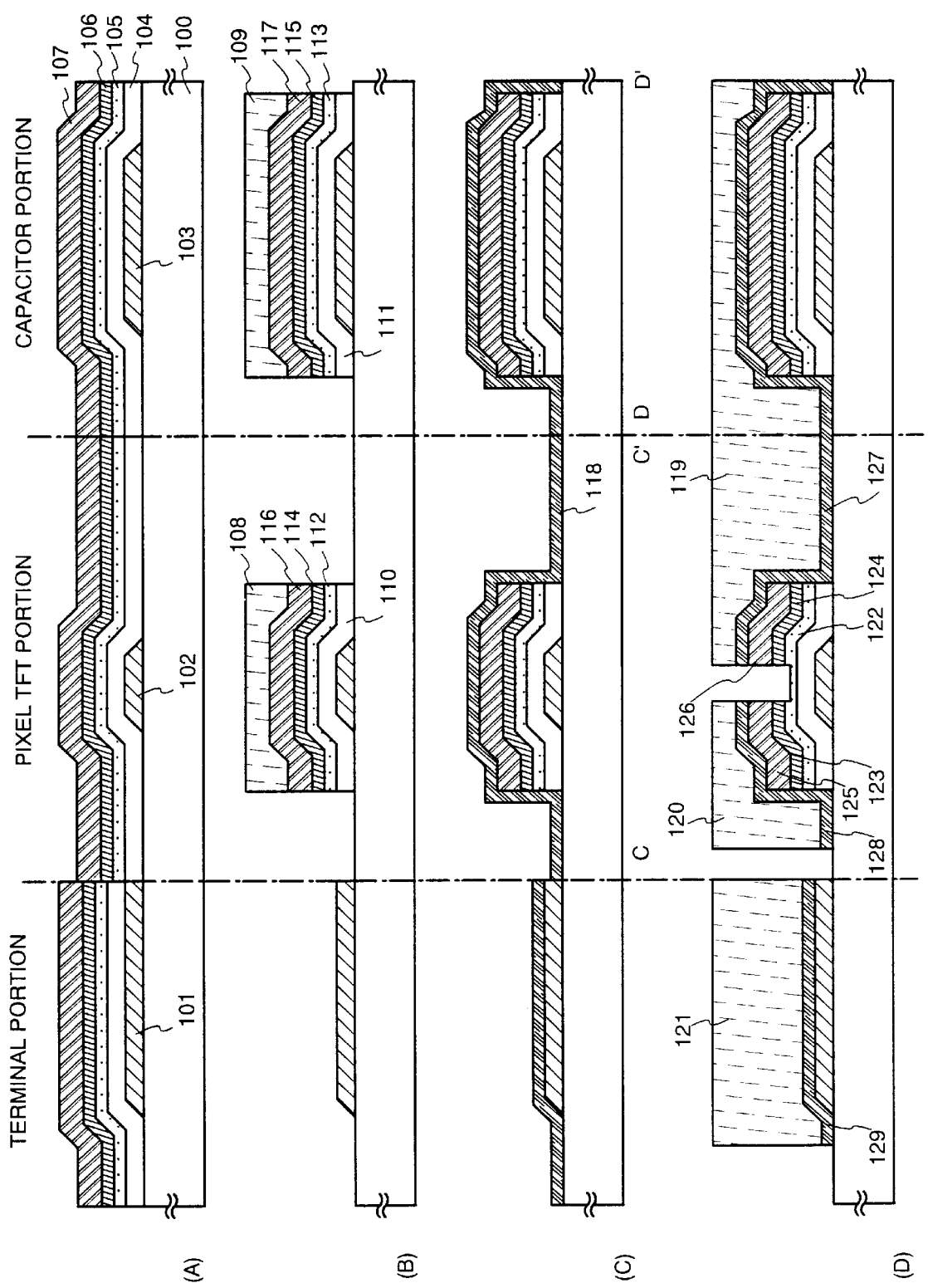
[FIG. 2]

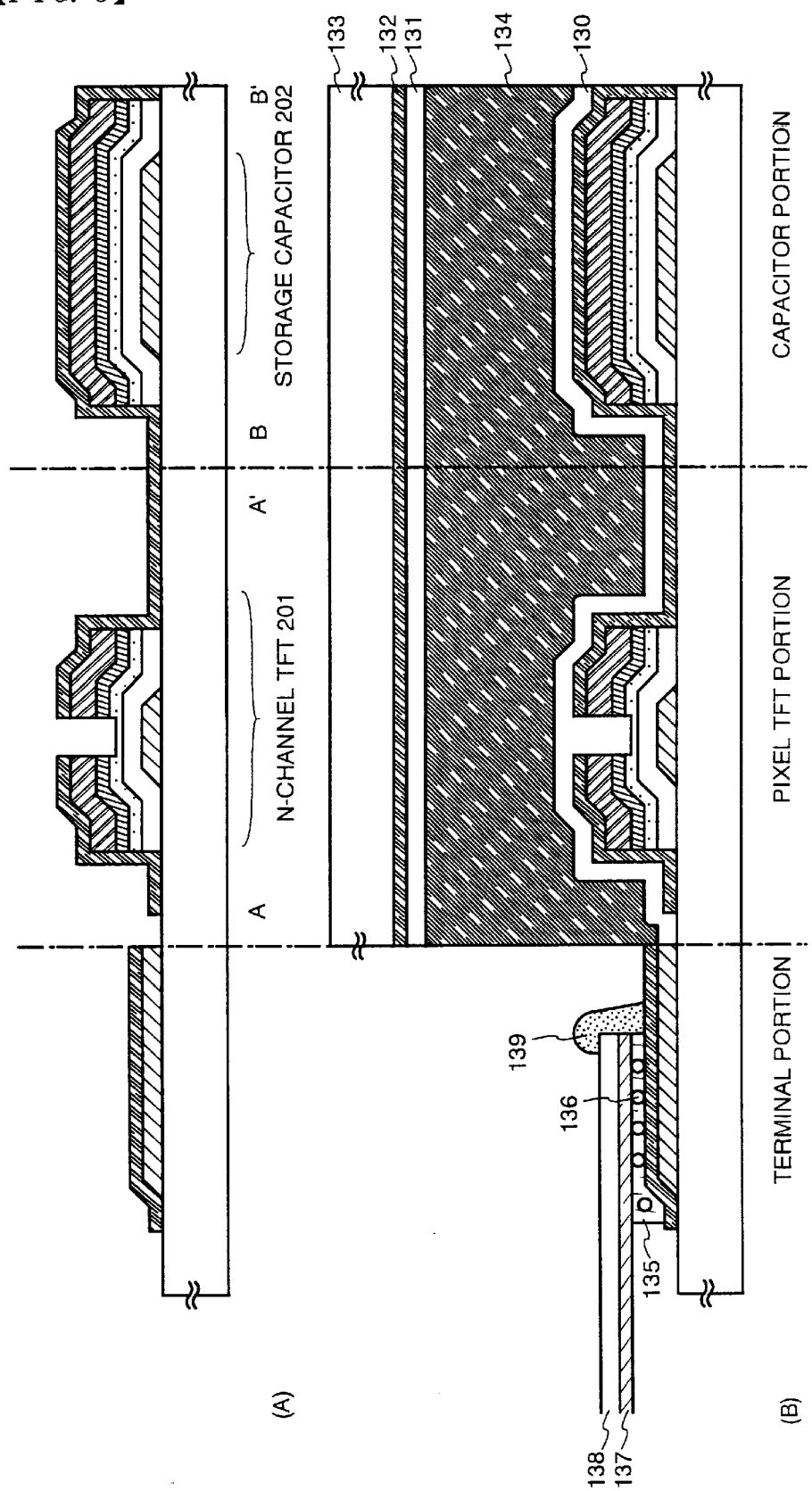
[FIG. 3]

[FIG. 4]
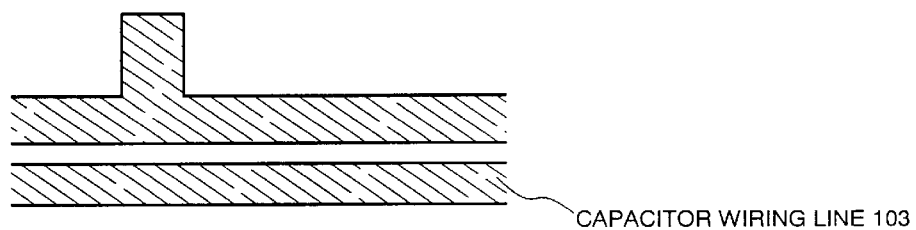
CAPACITOR WIRING LINE 103
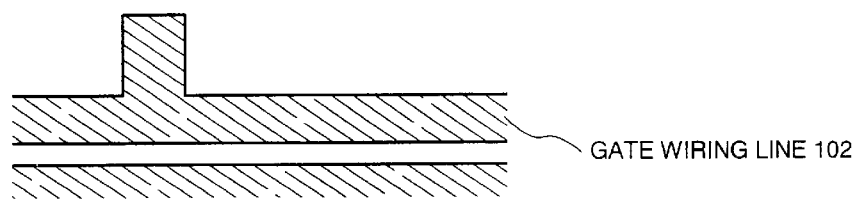
GATE WIRING LINE 102

[FIG. 5]
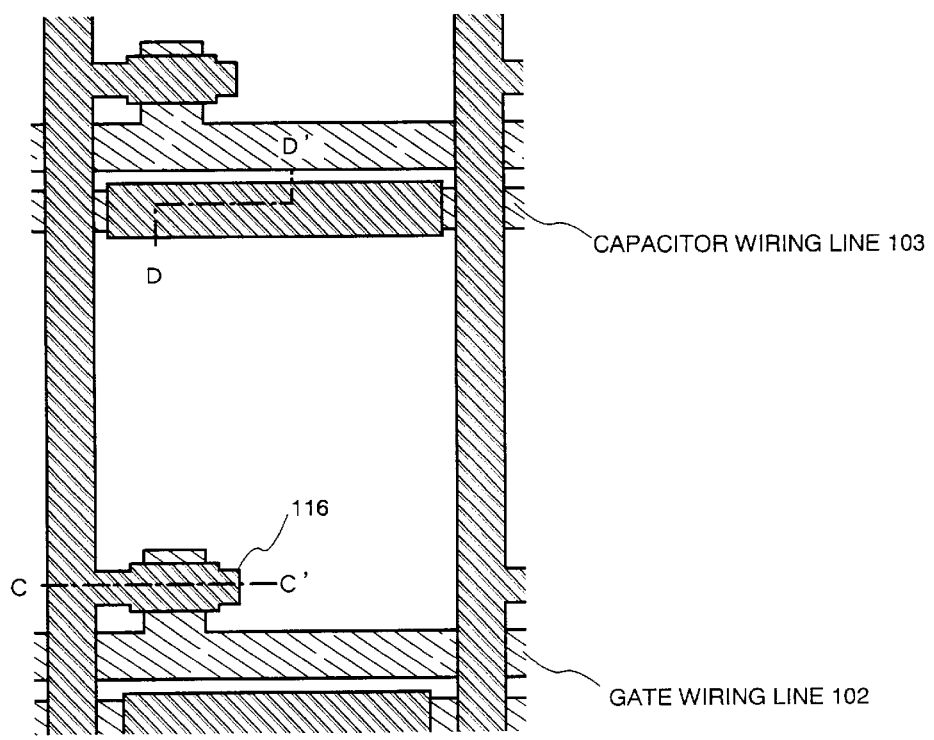

[FIG. 6]
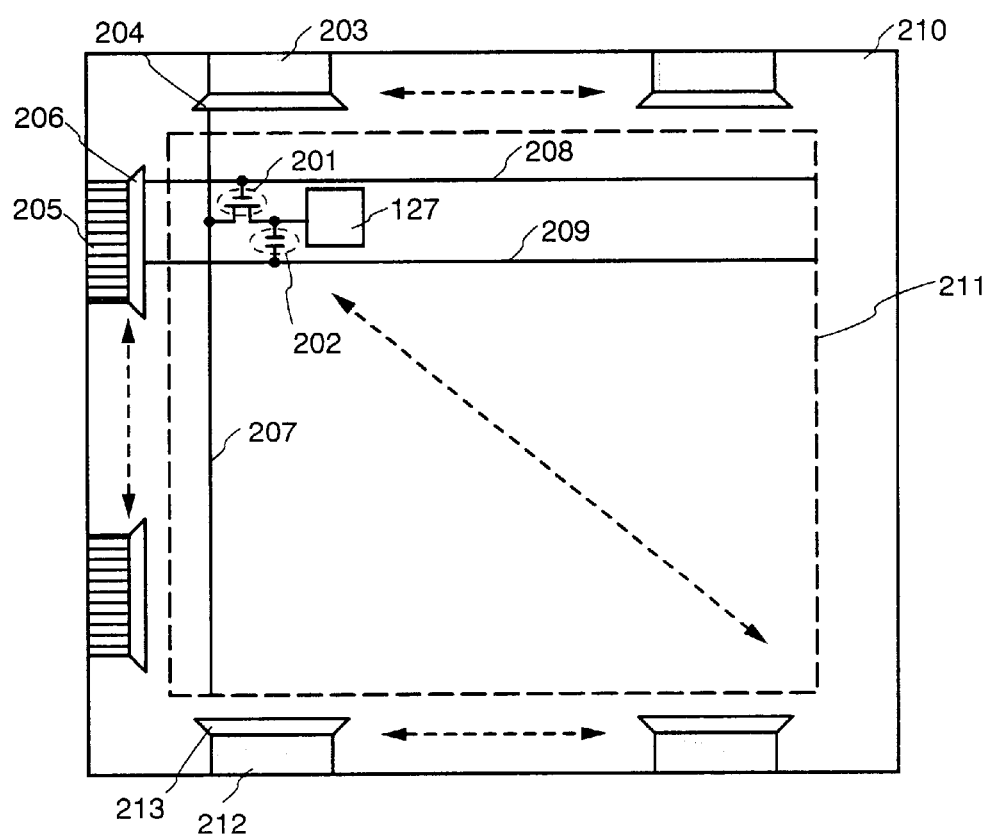

[FIG. 7]
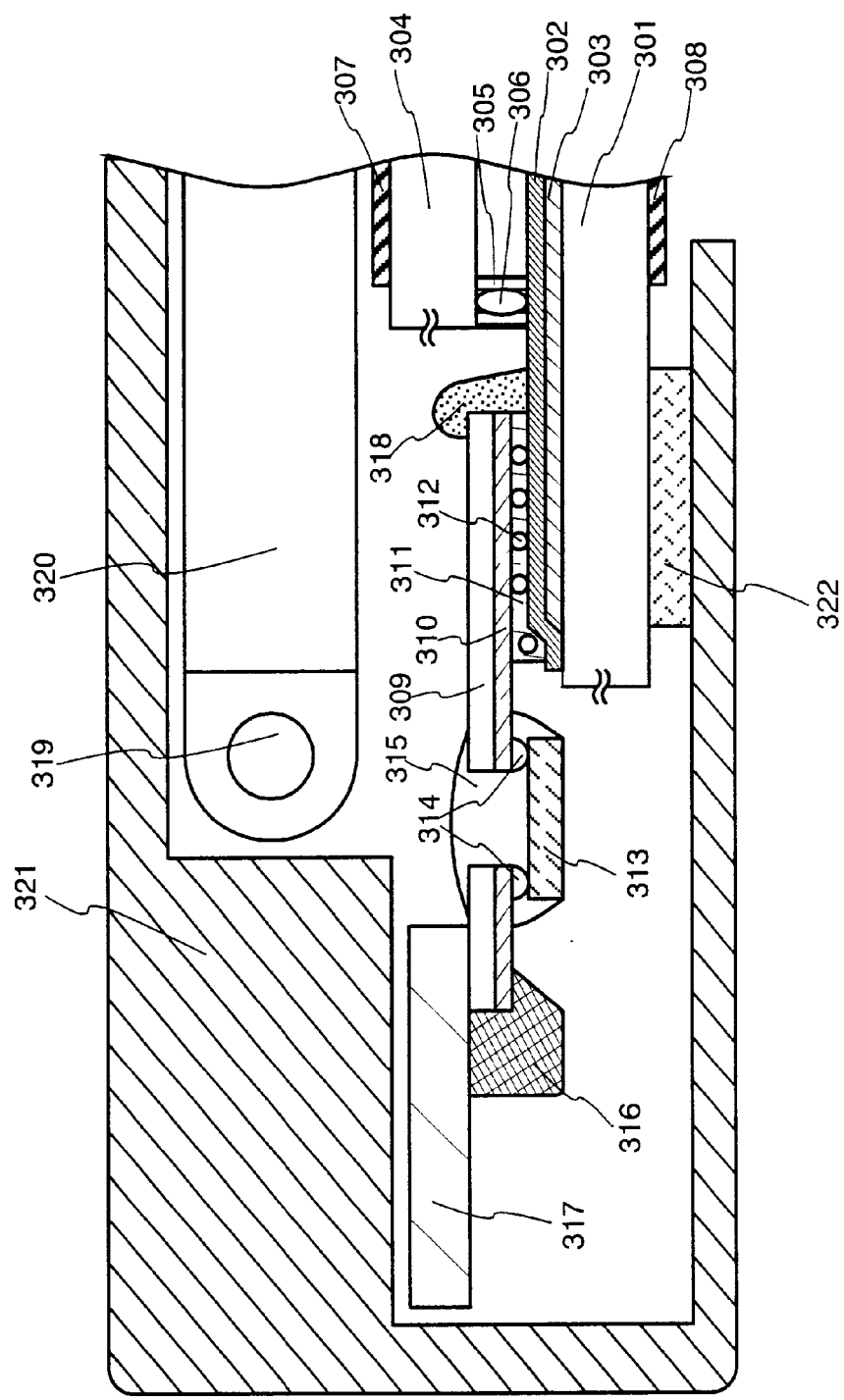

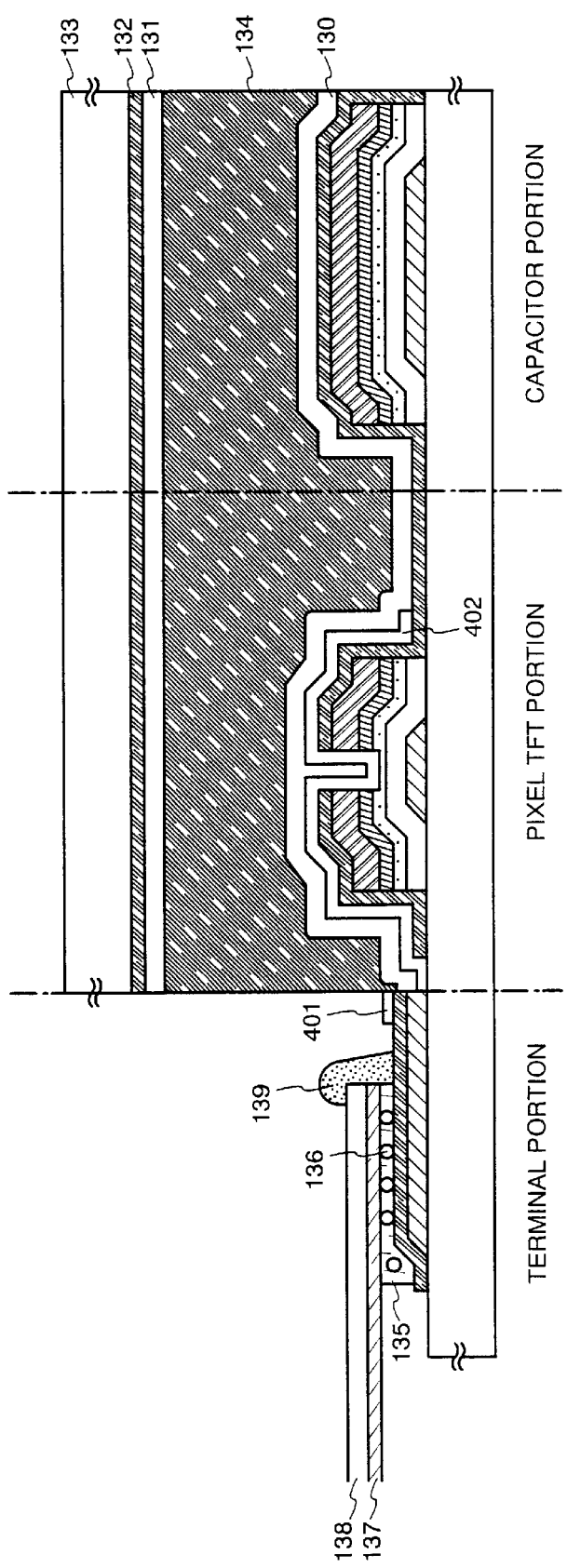
[FIG. 8]

[FIG. 9]
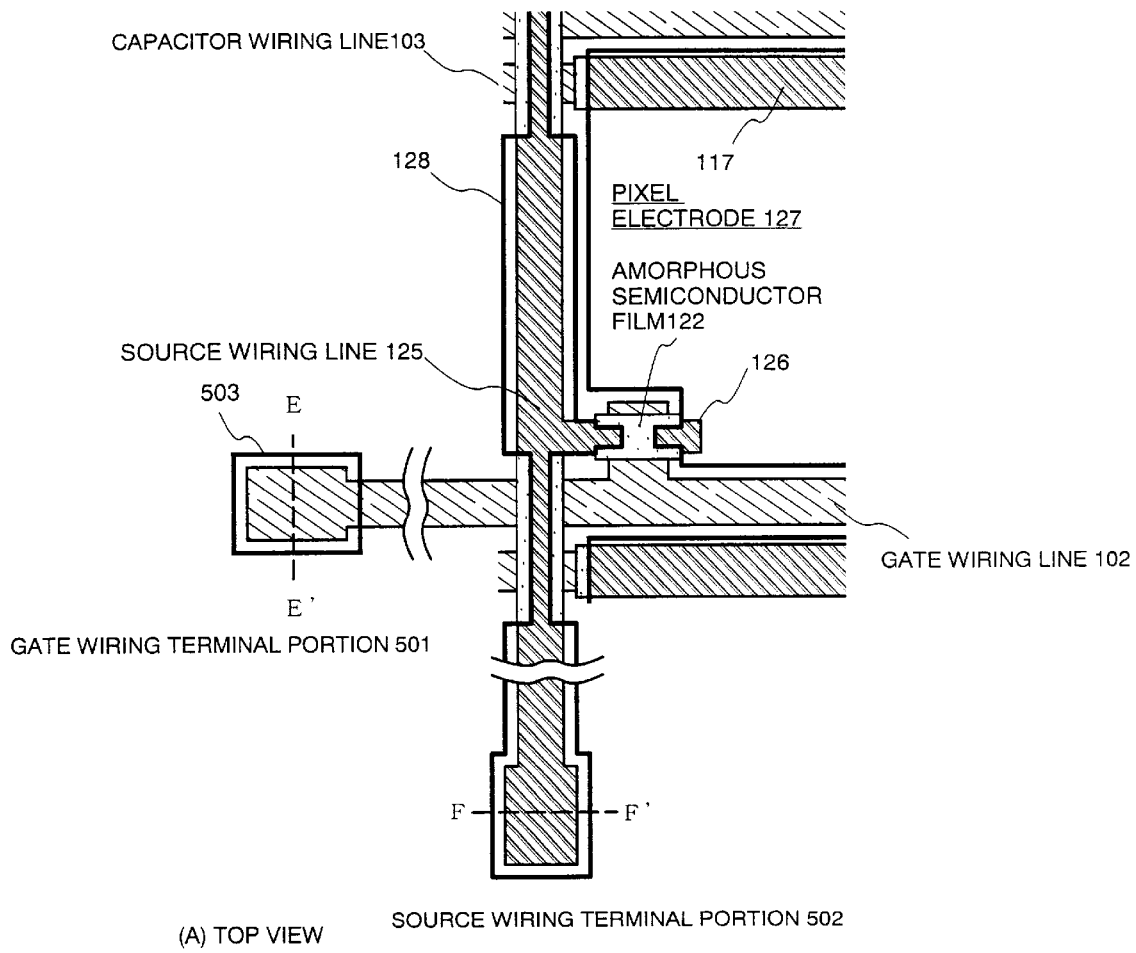
(A) TOP VIEW
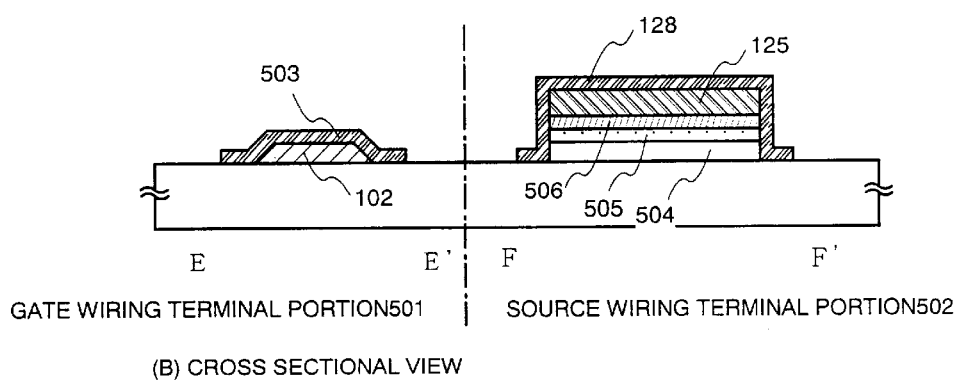
(B) CROSS SECTIONAL VIEW

[FIG. 10]
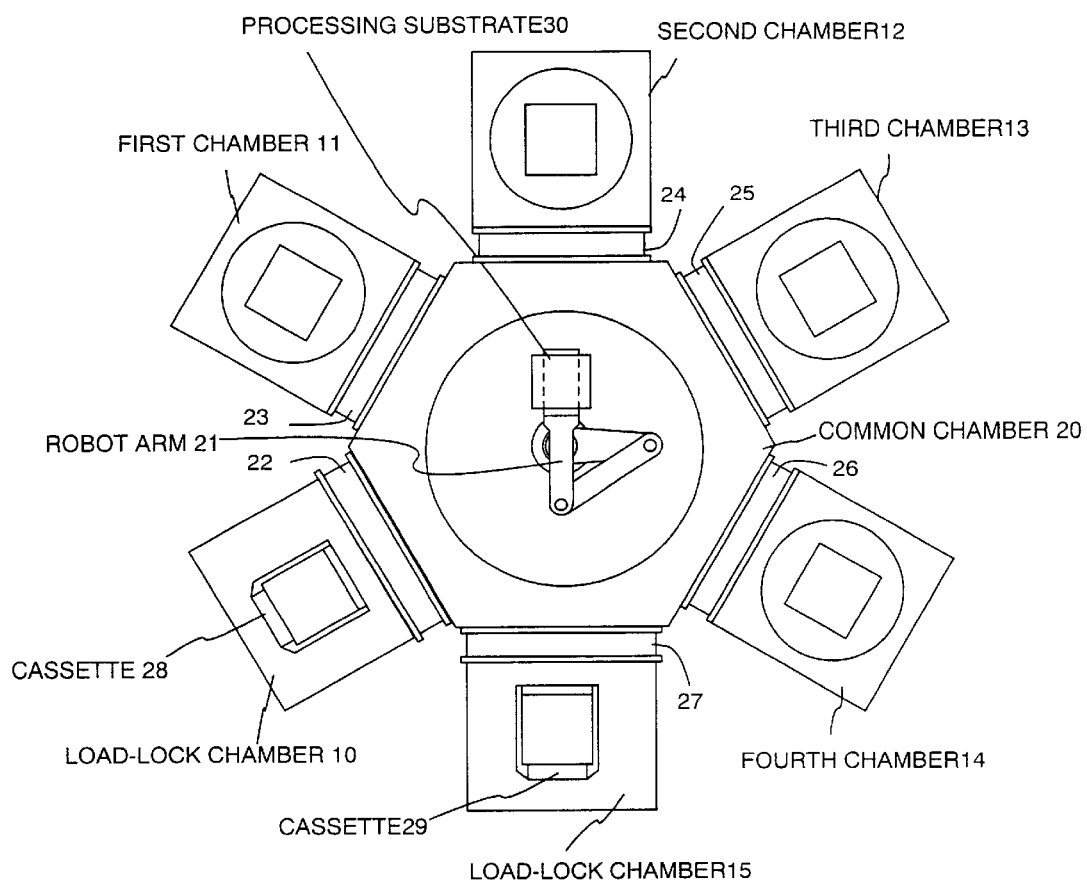

[FIG. 11]
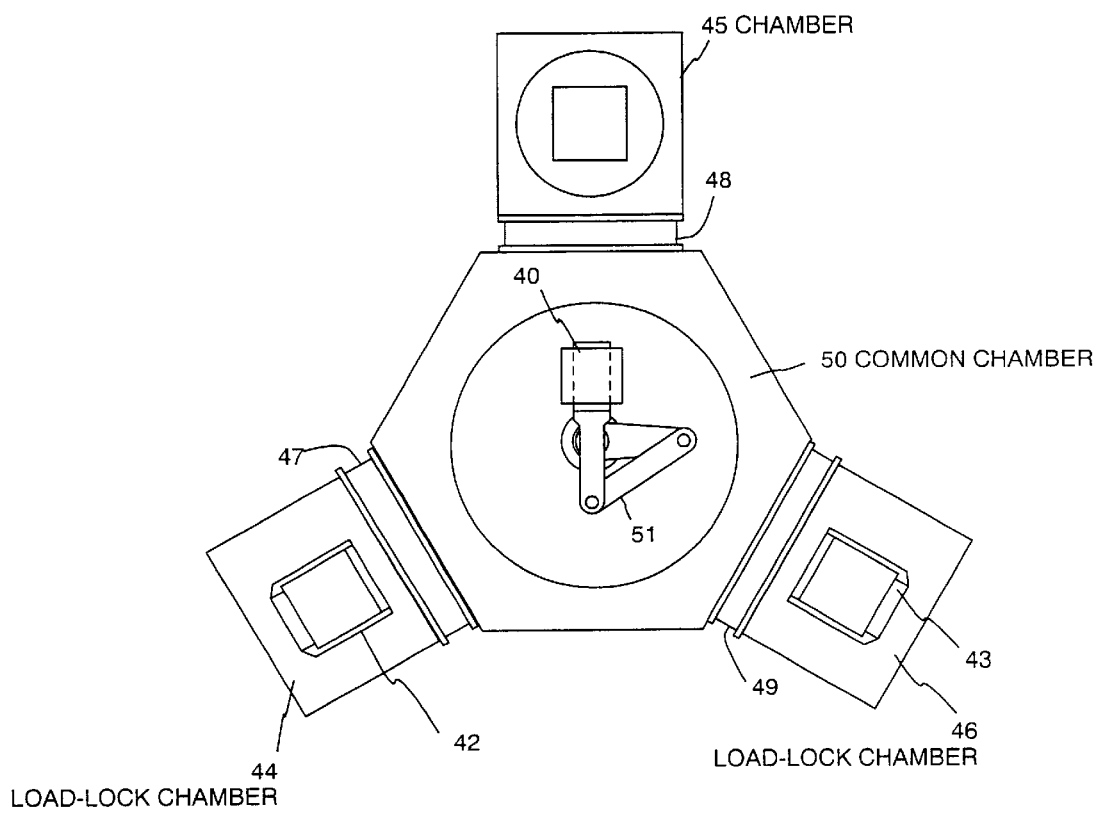

[FIG. 12]
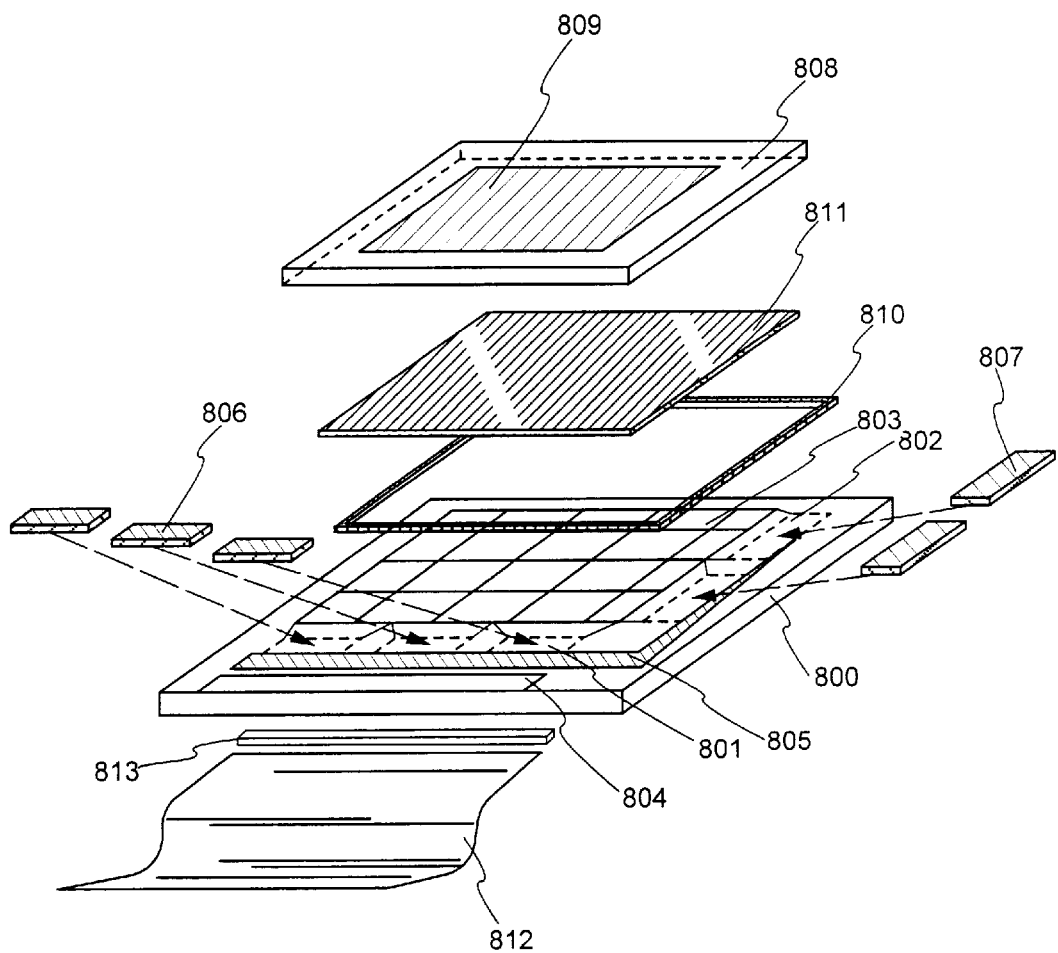
800: FIRST SUBSTRATE, 801: REGION FOR ATTACHING IC CHIP (DATA LINE),
802: REGION FOR ATTACHING IC CHIP (SCANNING LINE), 803: PIXEL REGION,
804: INPUT-OUTPUT TERMINAL, 805: CONNECTION WIRING, 806, 807: IC CHIP,
808: SECOND SUBSTRATE, 809: OPPOSING ELECTRODE, 810: SEALING MATERIAL,
811: LIQUID CRYSTAL LAYER, 812: FPC, 813: REINFORCING PLATE

[FIG. 13]
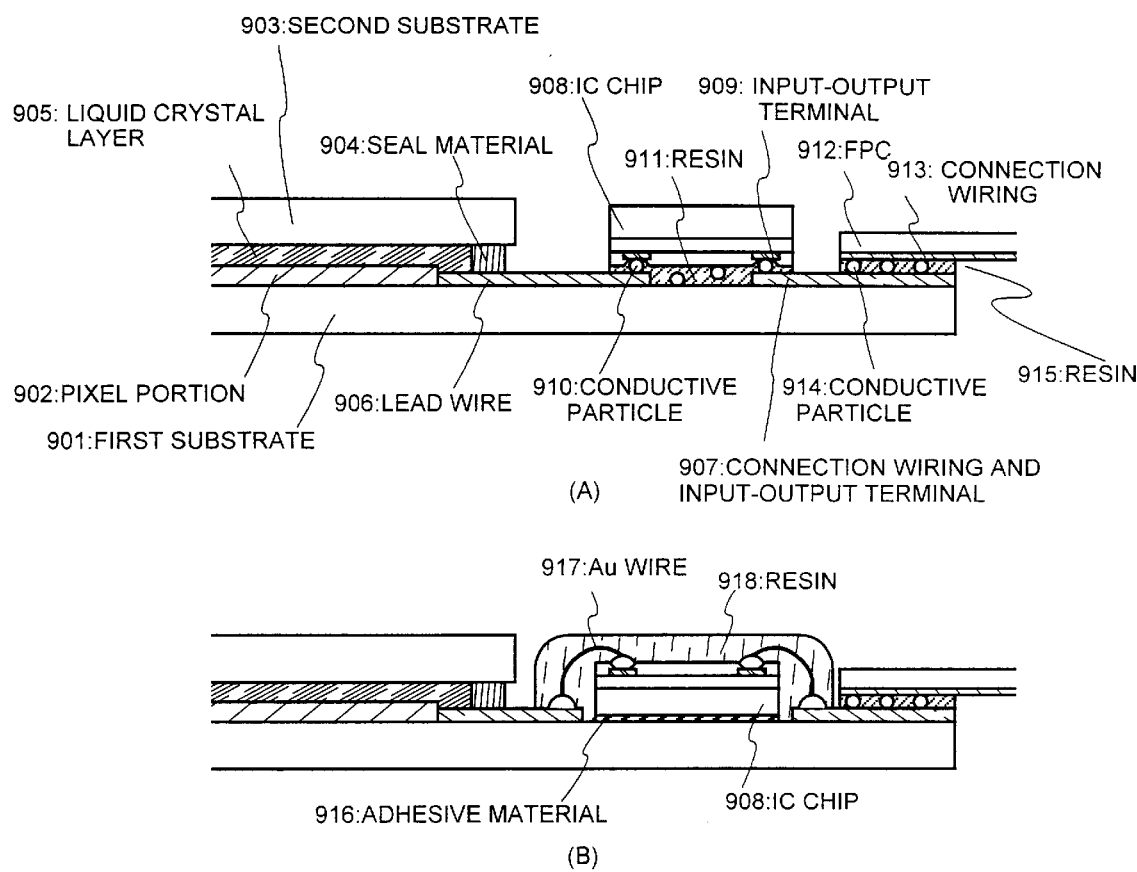

[FIG. 14]
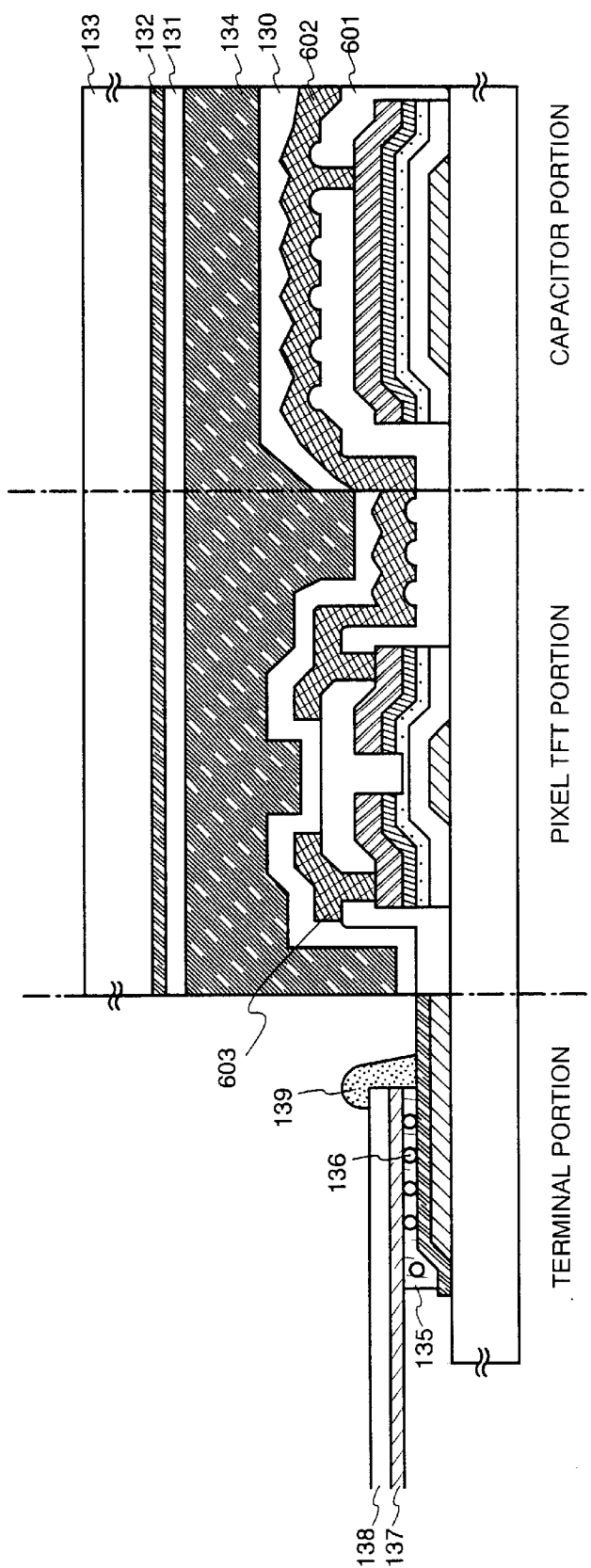

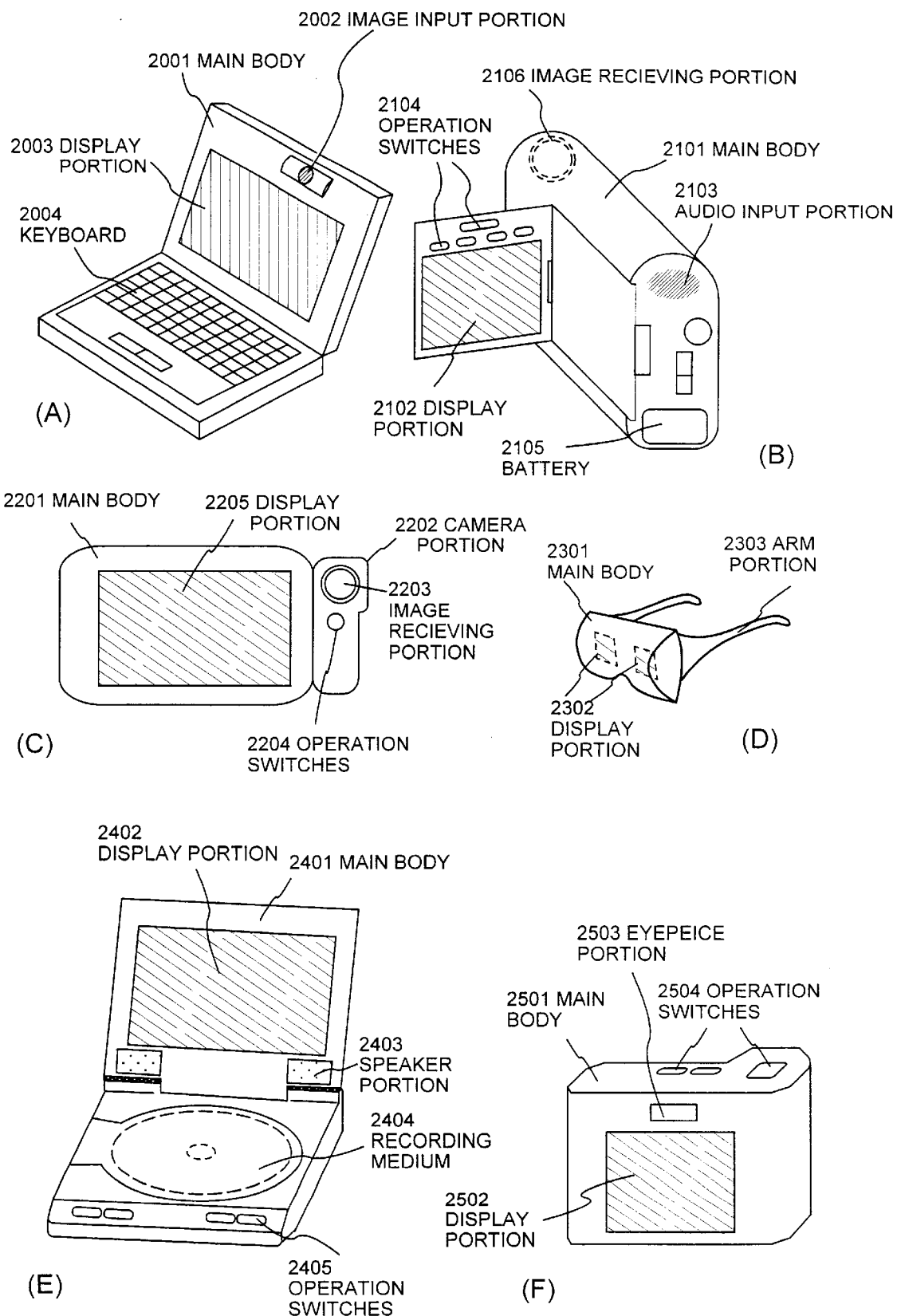

[FIG. 16]
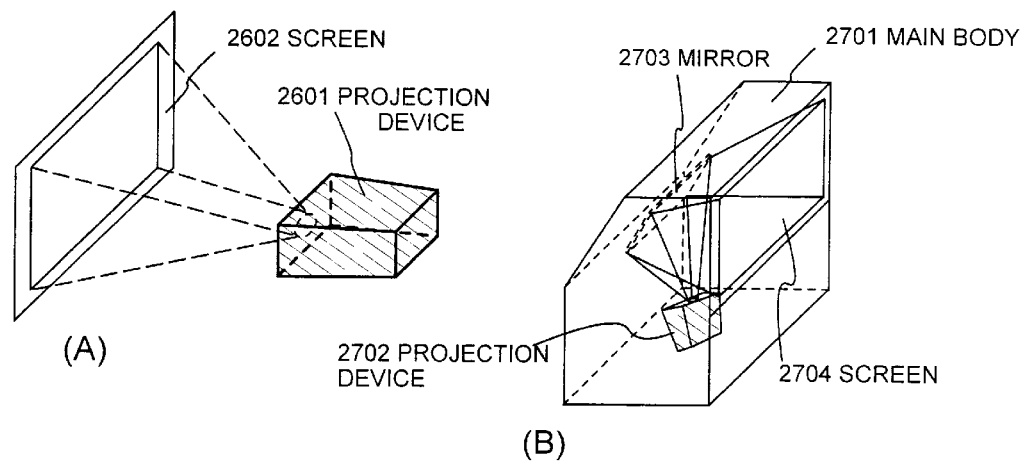
(A)
(B)
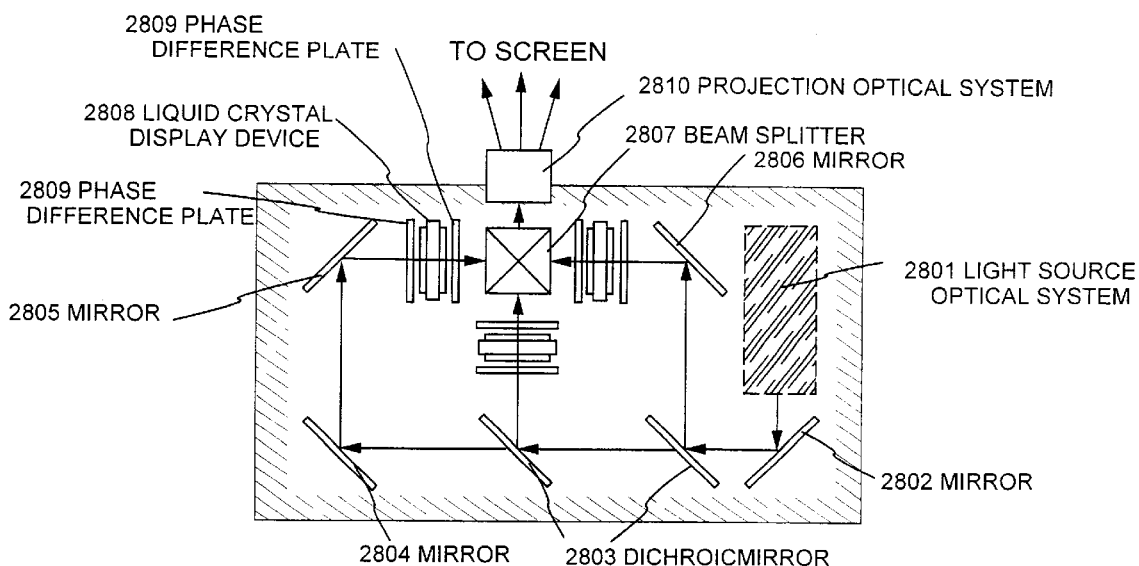
(C) PROJECTION DEVICE
(THREE-PLATE SYSTEM)
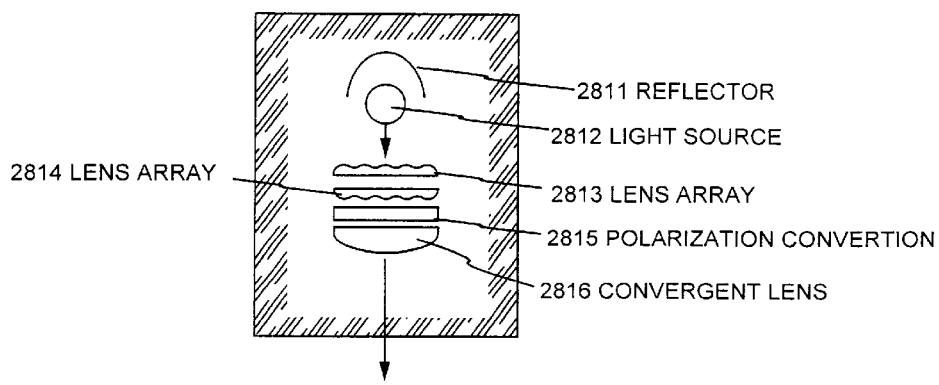
(D) LIGHT SOURCE OPTICAL SYSTEM

[FIG. 17]
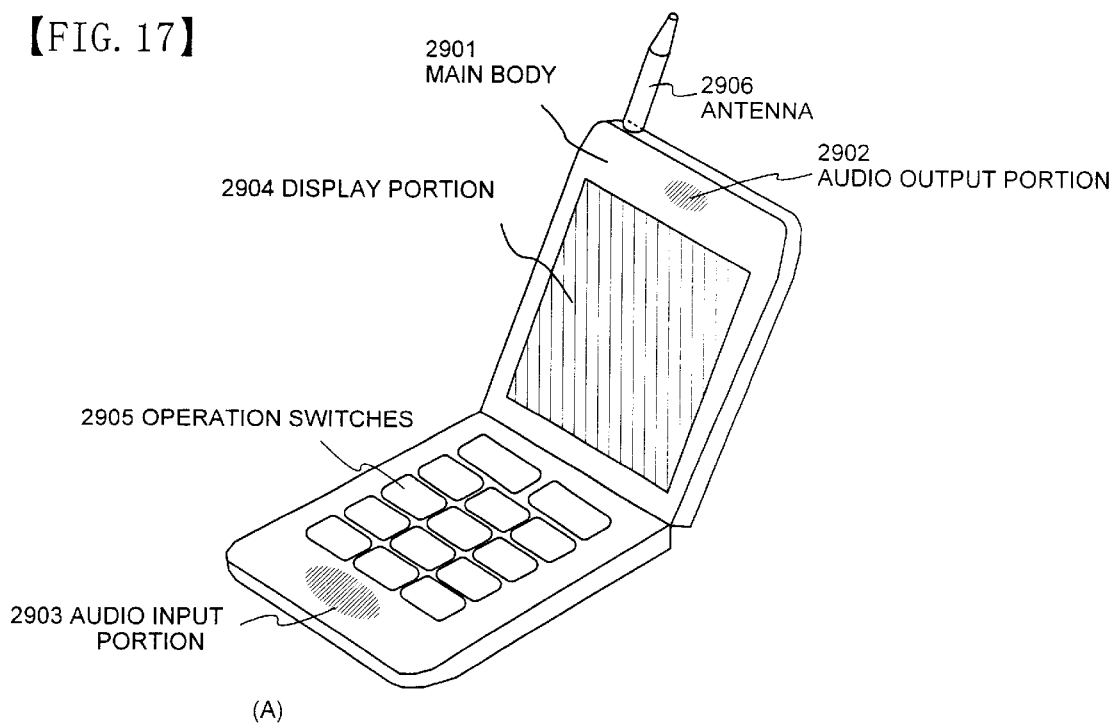
(A)
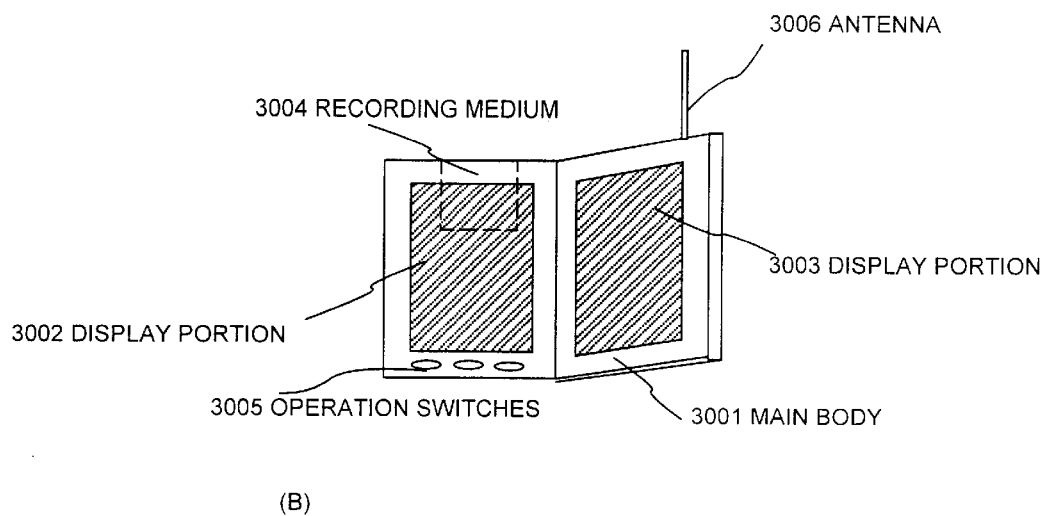
(B)
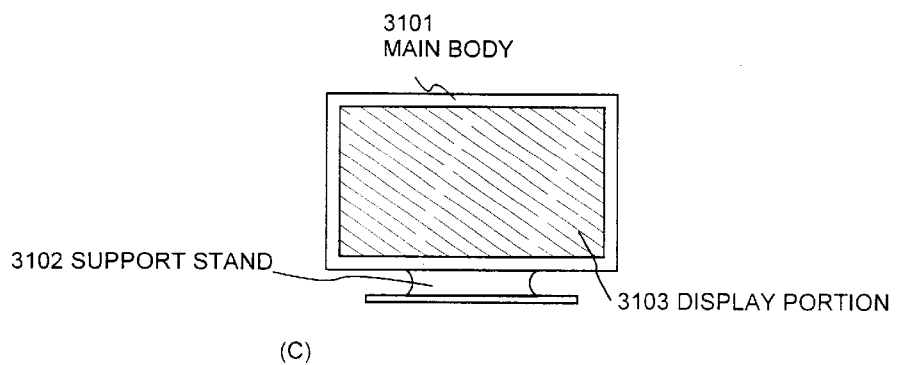
(C)

SEMICONDUCTOR DEVICE AND MANUFACTURING METHOD THEREOF

DETAILED DESCRIPTION OF THE INVENTION

Technical Field to which the Invention Belongs

The present invention relates to a semiconductor device having a circuit comprising a thin film transistor (hereafter referred to as TFT), and to a method of manufacturing thereof. For example, the present invention relates to an electro-optical device, typically a liquid crystal display panel, and to electronic equipment loaded with this type of electro-optical device as a part.

Note that, throughout this specification, semiconductor device denotes a general device which can function by utilizing semiconductor characteristics and that the category of semiconductor devices includes electro-optical devices, semiconductor circuits, and electronic equipment.

In recent years, techniques of structuring a thin film transistor (TFT) by using a semiconductor thin film (with a thickness on the order of several nm to several hundred of nm) formed over a substrate having an insulating surface have been in the spotlight. The thin film transistor is being widely applied in an electronic device such as an IC or an electro-optical device, and in particular, its development as a switching element of an image display device has been proceeding rapidly.

Conventionally, a liquid crystal display device is known as an image display device. Active matrix liquid crystal display devices have come into widespread due to the fact that, compared to passive liquid crystal display devices, a higher precision image can be obtained. By driving pixel electrodes arranged in a matrix state in the active matrix liquid crystal display device, a display pattern is formed on a screen in an active matrix liquid crystal display device. In more detail, by applying a voltage between a selected pixel electrode and an opposing electrode corresponding to the pixel electrode, optical modulation of a liquid crystal layer arranged between the pixel electrode and the opposing electrode is performed, and the optical modulation is recognized as a display pattern by an observer.

The use of this type of active matrix liquid crystal display device is spreading, and along with making the screen size larger, demands for higher precision, higher aperture ratio, and higher reliability are increasing. Further, at the same time, demands are increasing for improving productivity and lowering costs.

Conventionally, an amorphous silicon film is ideally used as an amorphous semiconductor film because of the capability of forming it on a large surface area substrate at a low temperature equal to or less than 300° C. Further, a reversed stagger type (or bottom gate type) TFT having a channel forming region formed by an amorphous semiconductor film is often used.

Problem to be Solved by the Invention

Conventionally, the production costs have been high in order to manufacture a TFT on a substrate with a technique of photolithography using at least 5 photomasks for an active matrix type liquid crystal display device. In order to improve productivity and yield, reducing the number of steps is considered as an effective means.

Specifically, it is necessary to reduce the number of photomasks needed to manufacture the TFT. The photomask is used in a photolithography technique in order to form a photoresist pattern, which becomes an etching process mask, over the substrate.

By using one photomask, there are applied with steps such as applying resist, pre-baking, exposure, development, and post-baking, and in addition, steps of film deposition and etching, resist peeling, cleaning, and drying are added before and after these steps. Therefore, the entire process becomes complex, which leads to a problem.

Further, static electricity is generated by causes such as friction during manufacturing steps because the substrate is an insulator. Short circuits develop at an intersection portion of wirings formed on the substrate when static electricity is generated, and then deterioration or breakage of the TFT due to static electricity leads to display faults or deterioration of image quality in liquid crystal display devices. In particular, static electricity develops during rubbing in the liquid crystal aligning process performed in the manufacturing steps, and this becomes a problem.

The present invention is for solving such problems, and an object of the present invention is to reduce the number of steps for manufacturing a TFT, and to realize a reduction in the production cost and an improvement in yield for a semiconductor device typified by an active matrix type liquid crystal display device.

Further, an object of the present invention is to provide a structure and a method of manufacturing the structure for resolving the problems of damage to the TFT and deterioration of TFT characteristics due to static electricity.

Means for Solving the Problem

In order to solve the above problems, in the present invention, first, a gate wiring line is formed by a first photomask.

Next, a gate insulating film, a non-doped amorphous silicon film (hereinafter referred to as a-Si film), an amorphous silicon film containing an impurity element to give an n-type conductivity (hereinafter referred to as n$^+$a-Si film), and a conductive film are continuously formed.

Next, a gate insulating film, an active layer comprising the a-Si film, a source wiring line (including a source electrode), and a drain electrode are formed through patterning by a second photomask.

Thereafter, after a transparent conductive film is formed, a pixel electrode made of the transparent conductive film is formed by a third photomask, and further, at the same time that a source region and a drain region comprising the n$^+$a-Si film are formed, a part of the a-Si film is removed.

By adopting such structure, the number of photomasks used in a photolithography technique can be made three.

Further, the source wiring is covered by a transparent conductive film comprising the same material as the pixel electrode, a structure which protects the entire substrate from eternal static electricity or the like is used. Furthermore, a structure in which a protecting circuit is formed using the transparent conductive film may also be used. The generation of static electricity due to friction between production equipment and the insulating substrate can be prevented during manufacturing processing by using this type of structure. In particular, the TFTs can be protected from static electricity generated during a liquid crystal alignment process of rubbing performed during manufacturing steps.

A structure of the present invention disclosed in this specification is:

a semiconductor device possessing a gate wiring, a source wiring, and a pixel electrode, having:

the gate wiring 102 formed on an insulating surface;

the insulating film 110 formed on the gate wiring;

the amorphous semiconductor film 122 formed on the insulating film;

the source region 123 and the drain region 124 formed on the amorphous semiconductor film;

the source wiring 125 or the electrode 126 formed on the source region or the drain region; and the pixel electrode 127 formed on the electrode; characterized in that:

one end surface of the drain region 124 or the source region 123 reversed corresponds with an end surface of the insulating film 110, an end of the amorphous semiconductor film 122 and an end surface of the electrode 126.

Further, another structure of the present invention is:

a semiconductor device possessing a gate wiring, a source wiring, and a pixel electrode, having:

the gate wiring 102 formed on an insulating surface;

the insulating film 110 formed on the gate wiring;

the amorphous semiconductor film 122 formed on the insulating film;

the source region 123 and the drain region 124 formed on the amorphous semiconductor film;

the source wiring 125 or the electrode 126 formed on the source region or the drain region; and the pixel electrode 127 formed on the electrode; characterized in that:

one end surface of the drain region 124 or the source region 123 reversed corresponds with an end surface of the insulating film 110, an end surface of the amorphous semiconductor film 122 and an end surface of the electrode 126; and the other end surface of the drain region 124 or the source region 123 reversed corresponds with an end surface of the pixel electrode 127 and the other end surface of the electrode 126.

Further, each of the above structures is characterized in that the source region and the drain region comprises an amorphous semiconductor film containing an impurity element which imparts n-type conductivity.

Still further, each of the above structures is characterized in that the insulating film, the amorphous semiconductor film, the source region, and the drain region are formed in succession without exposure to the atmosphere.

In addition, each of the above structures is characterized in that the insulating film, the amorphous semiconductor film, the source region, or the drain region is formed by a sputtering method.

Additionally, each of the above structures is, as shown in FIG. 2(D), characterized in that the source region 123 and the drain region 124 are formed by using the same mask as that of the amorphous semiconductor film 122 and the electrode 126. Moreover, it is characterized in that the source region and the drain region are formed by using the same mask as that of the source wiring 125.

Further, each of the above structures is, as shown in FIG. 2(D), characterized in that the source region 123 and the drain region 124 are formed by using the same mask as that of the source wiring 125 and the pixel electrode 127.

In addition, in each of the above structures, by etching process shown in FIG. 2(D), there is provided a structure in which, in the amorphous semiconductor film, the film thickness in a region that contacts with the source region and the drain region is formed thicker than the film thickness in a region between a region that contacts with the source region and a region that contacts with the drain region, that is, a channel etch type bottom gate structure.

Besides, the structure of the invention for realizing the above construction is a method of fabricating a semiconductor device, characterized by comprising:

a first step of forming a gate wiring line 102 by using a first mask;

a second step of forming an insulating film 104 covering the gate wiring line;

a third step of forming a first amorphous semiconductor film 105 on the insulating film;

a fourth step of forming a second amorphous semiconductor film 106 containing an impurity element to give an n-type conductivity on the first amorphous semiconductor film;

a fifth step of forming a first conductive film 107 on the second amorphous semiconductor film, a sixth step of forming a wiring line 116 (a source wiring line and an electrode) by selectively removing the insulating film 104, the first amorphous semiconductor film 105, the second amorphous semiconductor film 106, and the first conductive film 107 by using a second mask;

a seventh step of forming a second conductive film 118 being in contact with and overlapping with the wiring line 116 (the source wiring line and the electrode); and an eighth step of forming a source region 123 and a drain region 124 comprising the second amorphous semiconductor film, and a pixel electrode 127 made of the second conductive film by selectively removing a part of the first amorphous semiconductor film 112, the second amorphous semiconductor film 114, the first conductive film 116, and the second conductive film 118 by using a third mask.

Besides, in the above structure, it is characterized in that formation is continuously made without being exposed to the air from the second step to the fifth step.

Besides, in the above respective structures, it is characterized in that formation is continuously made in the same chamber from the second step to the fifth step.

Besides, in the above respective structures, the insulating film may be formed by a sputtering method or a plasma CVD method.

Besides, in the above respective structures, the first amorphous semiconductor film may be formed by a sputtering method or a plasma CVD method.

Besides, in the above respective structures, the second amorphous semiconductor film may be formed by a sputtering method or a plasma CVD method.

Besides, in the above respective structures, it is characterized in that the second conductive film is a transparent conductive film or a conductive film having reflectivity.

BRIEF DESCRIPTION OF THE DRAWINGS

FIG. 1 A view showing a top view of the present invention.

FIG. 2 A sectional view showing a fabricating process of an AM-LCD.

FIG. 3 A sectional view showing the fabricating process of the AM-LCD.

FIG. 4 A top view showing a fabricating process of an AM-LCD.

FIG. 5 A top view showing the fabricating process of the AM-LCD.

FIG. 6 A top view for explaining the arrangement of a pixel portion and an input terminal portion of a liquid crystal display device.

FIG. 7 A sectional view showing a mounting structure of a liquid crystal display device.

FIG. 8 A sectional view showing a fabricating process of an AM-LCD.

FIG. 9 A top view and a sectional view of an input terminal portion.

FIG. 10 A top view of a fabricating apparatus.

FIG. 11 A top view of a fabricating apparatus.

FIG. 12 A view showing the mounting of a liquid crystal display device.

FIG. 13 A sectional view showing a mounting structure of a liquid crystal display device.

FIG. 14 A structural sectional view of an active matrix substrate.

FIG. 15 A view showing an example of electronic equipment.

FIG. 16 A view showing an example of electronic equipment.

FIG. 17 A view showing an example of electronic equipment.

EMBODIMENT MODE OF THE INVENTION

The mode of carrying out the invention will be described below.

FIG. 1 is an example of a plan view of an active matrix substrate of the present invention, and here, for simplification, one pixel structure among a plurality of pixels arranged in matrix form is shown. FIGS. 2 and 3 are views showing a fabricating process.

As shown in FIG. 1, this active matrix substrate includes a plurality of gate wiring lines arranged in parallel with each other, and a plurality of source wiring lines perpendicular to the respective gate wiring lines.

A pixel electrode 127 comprising a transparent conductive film is disposed at a region surrounded by the gate wiring lines and the source wiring lines. Besides, a transparent conductive film 128 overlaps with the source wiring line so as not to overlap with the pixel electrode 127.

Further, a capacitance wiring line 103 is disposed below the pixel electrode 127, between adjacent two gate wiring lines, and in parallel with the gate wiring line 102. This capacitance wiring line 103 is provided for every pixel, and forms a storage capacitor with an insulating film 111 shown in FIG. 2(B) as a dielectric.

Besides, a TFT as a switching element is provided in the vicinity of an intersection of the gate wiring line 102 and the source wiring line 125. This TFT is a reversed stagger type (or bottom gate type) TFT including a channel formation region comprising a semiconductor film having an amorphous structure (hereinafter referred to as an amorphous semiconductor film).

Besides, in this TFT, a gate electrode (formed integrally with the gate wiring line 102), a gate insulating film, an a-Si film, a source region and a drain region comprising an n$^+$a-Si film, a source electrode (formed integrally with the source wiring line 125), and an electrode 126 (hereinafter also referred to as a drain electrode) are sequentially formed to be laminated on an insulating substrate.

Besides, the gate insulating film does not exist over the gate wiring line in a region where the gate wiring line does not overlap with the a-Si film.

Thus, the pixel electrode 127 overlapping with the electrode 126 is formed so as not to overlap with the gate wiring line.

Besides, at the intersection of the gate wiring line and the source wiring line, the transparent conductive film at the end portion of the source wiring line is removed so as to prevent shorting. Besides, the end of an electrode 117 is removed so as to prevent shorting between the capacitance wiring line and the pixel electrode.

Besides, under the source wiring line (including the source electrode) and the drain electrode 126, the gate insulating film, the a-Si film, and the n$^+$a-Si film are sequentially formed to be laminated on the insulating substrate.

Besides, the a-Si film in a region between a region that contacts with the source region and a region that contacts with the drain region, is thin as compared with that in the other regions. The film is thin since, when the n$^+$a-Si film was separated by etching to form the source region and the drain region, a part of the a-Si film was removed. Besides, by this etching, an end surface of the pixel electrode, an end surface of the drain electrode, and an end surface of the drain region are coincident with each other.

Besides, similarly, an end surface of the transparent conductive film covering the source electrode, an end surface of the source region, and an end surface of the source wiring line are coincident with each other.

The present invention made of the foregoing structure will be described in more detail with embodiments shown below.

EMBODIMENTS

EMBODIMENT 1

An embodiment of the invention are explained using FIGS. 1 to 6 and 9. The present embodiment shows a method of manufacturing a liquid crystal display device, and a detailed explanation of a method of forming a TFT of a pixel portion on a substrate by a reversed stagger type TFT, and manufacturing a storage capacitor connected to the TFT, is made in accordance with the processes used. Further, a manufacturing process for an input terminal section, formed in an edge portion of the substrate, and for electrically connecting to wirings of circuits formed on other substrates, is shown at the same time in the same figures.

In FIG. 2(A), a glass substrate, comprising such as barium borosilicate glass or aluminum borosilicate glass, typically Coming Corp. #7059 or #1737, can be used as a substrate 100 having translucency. In addition, a translucent substrate such as a quartz substrate or a plastic substrate can also be used.

Next, after forming a conductive layer on the entire surface of the substrate, a first photolithography process is performed, a resist mask is formed, unnecessary portions are removed by etching, and wirings and electrodes (the gate wiring 102 including a gate electrode, a capacitor wiring 103 and a terminal 101) are formed. Etching is performed at this time to form a tapered portion in at least an edge portion of the gate electrode 102. A top view of this stage is shown in FIG. 4.

It is preferable to form the gate wiring 102 including the gate electrode, the capacitor wiring 103, and the terminal 101 of the terminal portion from a low resistivity conductive material such as aluminum (Al) or the like, but simple Al has problems such as inferior heat resistance and easy to be corroded, and therefore it is combined with a heat resistant conductive material. One element selected from the group consisting of titanium (Ti), tantalum (Ta), tungsten (W), molybdenum (Mo), chromium (Cr), Neodymium (Nd), or an alloy comprising the above elements, or an alloy film of a combination of the above element, or a nitrated compound comprising the above element is formed as the heat resistant conductive material. Furthermore, forming in combination with a heat resistant conductive material such as Ti, Si, Cr, or Nd, it is preferable because of improved flatness. Further, only such heat resistant conductive film may also be formed, for example, in combination with Mo and W.

In realizing the liquid crystal display device, it is preferable to form the gate electrode and the gate wiring by a combination of a heat resistant conductive material and a low resistivity conductive material. An appropriate combination in this case is explained.

Provided that the screen size is on the order of, or less than, 5 inch diagonal type, a two layer structure of a lamination of a conductive layer (A) comprising a nitride compound of a heat resistant conductive material, and a conductive layer (B) comprising a heat resistant conductive material is used. The conductive layer (B) may comprise an element selected from the group consisting of Al, Ta, Ti, W, Nd, and Cr, or from an alloy of the above elements, or from an alloy film of a combination of the above elements, and the conductive layer (A) comprises a film such as a tantalum nitride (TaN) film, a tungsten nitride (WN) film, or a titanium nitride (TiN) film. For example, it is preferable to use a double layer structure of a lamination of Cr as the conductive layer (A) and Al containing Nd as the conductive layer (B). The conductive layer (A) is given a thickness of 10 to 100 nm (preferably between 20 and 50 nm), and the conductive layer (B) is made with a thickness of 200 to 400 nm (preferably between 250 and 350 nm).

On the other hand, in order to be applied to a large screen, it is preferable to use a three layer structure of a lamination of a conductive layer (A) comprising a heat resistant conductive material, a conductive layer (B) comprising a low resistivity conductive material, and a conductive layer (C) comprising a heat resistant conductive material. The conductive layer (B) comprising the low resistivity conductive material comprises a material comprising aluminum (Al), and in addition to pure Al, Al containing between 0.01 and 5 atomic % of an element such as scandium (Sc), Ti, Nd, or silicon (Si), etc. is used. The conductive layer (C) is effective in preventing generation of hillocks in the Al of the conductive layer (B). The conductive layer (A) is given a thickness of 10 to 100 nm (preferably between 20 and 50 nm), the conductive layer (B) has 200 to 400 nm thick (preferable between 250 and 350 nm), and the conductive layer (C) is from 10 to 100 nm thick (preferably between 20 and 50 nm). In the present embodiment, the conductive layer (A) comprises a Ti film with a thickness of 50 nm, made by sputtering with a Ti target, the conductive layer (B) comprises an Al film with a thickness of 200 nm, made by sputtering with an Al target, and the conductive layer (C) is a 50 nm thick Ti film, made by sputtering with a Ti target.

An insulating film 104 is formed next on the entire surface. The insulating film 104 is formed using sputtering, and has a film thickness of 50 to 200 nm.

For example, a silicon nitride film is used as the insulating film 104, and formed to a thickness of 150 nm. Of course, the gate insulating film is not limited to this type of silicon nitride film, and another insulating film such as a silicon oxide film, a silicon oxynitride film, or a tantalum oxide film may also be used, and the gate insulating film may comprise a single layer or a lamination structure comprising these materials. For example, a lamination structure having a silicon nitride film as a lower layer and a silicon oxide film as an upper layer may be used.

Next, an amorphous semiconductor film 105 is formed with a thickness of 50 to 200 nm (preferably between 100 and 150 nm) on the insulating film 104 over the entire surface by using a known method such as plasma CVD or sputtering (not shown in the figure). Typically, an amorphous silicon (a-Si) film is formed with a thickness of 100 nm by sputtering using a silicon target. In addition, it is also possible to apply a microcrystalline semiconductor film, or a compound semiconductor film having an amorphous structure, such as an amorphous silicon germanium film.

An amorphous semiconductor film 106 containing an impurity element imparting n-type is formed next with a thickness of 20 to 80 nm as a semiconductor film 106 which contains an impurity element imparting one conductivity type. The amorphous semiconductor film 106 containing an impurity element imparting n-type is formed on the entire surface by a known method such as plasma CVD or sputtering. Typically it is appropriate to form an $n^+$a-Si:H film, and it is deposited by using a silicon target added with phosphorus (P). Alternatively, film deposition may be performed by sputtering using a silicon target in an atmosphere containing phosphorous. In addition, the amorphous semiconductor film 106 containing an impurity element imparting n-type may also comprise a hydrogenated microcrystalline silicon film ($\mu$c-Si:H).

Next, a conductive metal film 107 is formed by sputtering or vacuum evaporation. Provided that ohmic contact with the $n^+$a-Si film 106 can be made, there are no particular limitation on the material of the conductive metal film 107, and an element selected from the group consisting of Al, Cr, Ta, and Ti, or an alloy comprising the above elements, and an alloy film of a combination of the above elements or the like can be given. Note however that it is necessary to choose a material for the conductive metal film 107 which has a sufficient selective ratio with respect to the terminal and the gate wiring in the later etching process. In the present embodiment, sputtering is used and a Cr film having 300 to 600 thickness is formed as the metal film 107. (FIG. 2(A))

The insulating film 104, the amorphous semiconductor film 105, the semiconductor film 106 containing an impurity element which imparts one conductivity type, and the conductive metal film 107 are all manufactured by a known method, and can be manufactured by plasma CVD or sputtering. The films are formed in succession by sputtering, and suitably changing the target or the sputtering gas in the present embodiment. The same reaction chamber, or a plurality of reaction chambers, in the sputtering apparatus is used at this time, and it is preferable to laminate these films in succession without exposure to the atmosphere. By thus not exposing the films to the atmosphere, the mixing in of impurities can be prevented.

Next, a second photolithography process is performed, resist masks 108 and 109 are formed, and by removing unnecessary portions by etching, insulating films 110 and 111, a wiring and an electrode (source wiring) are formed. Wet etching or dry etching is used as the etching process at this time. The insulating film 104, the amorphous semiconductor film 105, the semiconductor film 106 containing an impurity element imparting one conductivity type and the conductive metal film 107 are etched in the second photolithograpy process, and an insulating film 110, an amorphous semiconductor film 112, a semiconductor film containing an impurity element imparting one conductivity type 114 and a conductive metal film 116 are formed in the pixel TFT portion. Accordingly the edge surface of the films approximately coincide. Further in the capacitor portion an insulating film 111, an amorphous semiconductor film 113, a semiconductor film 115 containing an impurity element imparting one conductivity type and a conductive metal film 117 are formed. Similarly, the edge surface of these films coincide.

Further, in the above second photolithography process, the films are etched away leaving only the terminal 101 in the terminal portion. The insulating film on the gate wiring is also removed by leaving only intersecting portion with other wirings. Accordingly it is necessary to select a material for the terminal 101 and gate wiring that has sufficient selective ratio with respect to that of the insulating film, and it is further necessary to select a material which has a sufficient selective ratio for the materials of the terminal with respect to that of the conductive metal film. That is, it is necessary to choose different materials for the terminal and the gate wiring from that of the conductive metal film. In the present embodiment, the metal film 107 is etched by dry etching using a mixed gas of $Cl_2$ and $O_2$, and then the semiconductor film 106 containing an impurity element imparting one conductivity type, the amorphous semiconductor film 105 and the insulating film 104 are selectively removed by changing the reaction gas to a mixed gas of $CF_4$ and $O_2$. (FIG. 2(B))

Next, after removing the resist mask 108, a transparent conductive film 118 is deposited over the entire surface. (FIG.2(C)) A top view in this state is shown in FIG. 5. Note however, for simplification, the transparent conductive film 118 deposited over the entire surface is not shown in FIG. 5.

The transparent conductive film 118 comprises a material such as indium oxide ($In_2O_3$) or indium oxide tin oxide alloy ($In_2O_3$—$SnO_2$, abbreviated as ITO) using a method such as sputtering or vacuum evaporation. The etching process for this type of material is performed using a solution of hydrochloric acid type. However, a residue is easily generated, particularly in ITO etching, and therefore an indium oxide zinc oxide alloy ($In_2O_3$—$ZnO$) may be used in order to improve the etching workability. The indium oxide zinc oxide alloy has superior surface smoothing characteristics, and has superior thermal stability compared to ITO, and therefore even if the electrode 116 comprises an Al film, a corrosion reaction can be prevented. Similarly, zinc oxide (ZnO) is also a suitable material, and in addition, in order to increase the transmittivity of visible light and increase the conductivity, a material such as zinc oxide in which gallium (Ga) is added (ZnO:Ga) can be used.

Resist masks 119, 120 and 121 are formed next by a third photolithography process. Unnecessary portions are then removed by etching, forming an amorphous semiconductor film 122, a source region 123, a drain region 124, the source electrode 125, the drain electrode 126, and the pixel electrode 127. (FIG. 2(D))

The third photolithography process patterns the transparent conductive film 118, and at the same time removes a part of the conductive metal film 116, the $n^+$a-Si film 114 and the amorphous semiconductor film 112 by etching, forming an opening. In the present embodiment, the pixel electrode comprising ITO is selectively removed first by wet etching using a mixed solution of nitric acid and hydrochloric acid, or a ferric chloride solution, and after removing the conductive metal film 116 by wet etching, a part of the $n^+$a-Si film 114 and the amorphous semiconductor film 112 are etched by dry etching. Note that wet etching and dry etching are used in the present embodiment, but the operator may perform only dry etching by suitably selecting the reaction gas, and the operator may perform only wet etching by suitably selecting the reaction solution.

Further, the lower portion of the opening reaches the amorphous semiconductor film, and the amorphous semiconductor film 114 is formed having a concave portion. The conductive metal film 116 is separated into the source wiring 125 and the drain electrode 126 by the opening, and the $n^+$a-Si:H film 114 is separated into the source region 123 and the drain region 124. Furthermore, the transparent conductive film 128 contacting the source electrode 125 covers the source wiring, and during subsequent manufacturing processes, especially during a rubbing process, fulfills a role of preventing static electricity from developing. An example of forming the transparent conductive film 128 on the source wiring is shown in the present embodiment, but the transparent conductive film 128 may also be removed during the above etching of the ITO film. In addition, a circuit for protecting from static electricity may be formed by utilizing the above ITO film, in the etching of the ITO film.

Further, though not shown in the figure, it is necessary that the gate wiring have selective ratio with the amorphous semiconductor film and the metal film 116 since the transparent conductive film formed on the gate wiring is selectively removed by the above third photolithography process. Note however the transparent conductive film is partially left in the gate wiring terminal portion.

Resist masks 119 to 121 are next removed. The cross sectional view of this state is shown in FIG. 3(A). Note that FIG. 1 is a top view of one pixel and the cross sections along the A–A' line and the B–B' line correspond to FIG. 3(A) respectively.

Furthermore, FIG. 9(A) shows top views of a gate wiring terminal portion 501 and a source wiring terminal portion 502 in this state. Note that the same symbols are used for area corresponding to those of FIG. 1 to FIG. 3. Further, FIG. 9(B) corresponds to a cross-sectional view taken along the lines E–E' and F–F' in FIG. 9(A). Reference numeral 503 in FIG. 9(A) comprising a transparent conductive film denotes a connecting electrode which functions as an input terminal. In addition, in FIG. 9(B) reference numeral 504 denotes an insulating film (extended from 110), reference numeral 505 denotes an amorphous semiconductor film (extended from 122), and reference numeral 506 denotes an $n^+$a-Si film (extended from 123).

Note that a storage capacitor is formed in the capacitor portion between the capacitor wiring 103 and the metal film 117 (or $n^+$a-Si film 115 or semiconductor film) with the insulating film 111 as a dielectric.

By thus using three photomasks and performing three photolithography processes, the pixel TFT portion having the reversed stagger type n-channel type TFT 201 and the storage capacitor 202 can be completed. By placing these in matrix form corresponding to each pixel and thus composing the pixel portion, one substrate can be made in order to manufacture an active matrix liquid crystal display device. For convenience, this type of substrate is referred to as an active matrix substrate throughout this specification.

An alignment film 130 is selectively formed next in only the pixel portion of the active matrix substrate. Screen printing may be used as a method of selectively forming the alignment film 130, and a method of removal in which a resist mask is formed using a shadow mask after application of the alignment film may also be used. Normally, a polyimide resin is often used in the alignment film of the liquid crystal display element.

Next, a rubbing process is then performed on the alignment film 130, orienting the liquid crystal elements so as to possess a certain fixed pre-tilt angle.

The active matrix substrate, and an opposing substrate 133 on which an opposing electrode 132, and an alignment film 131 are formed are next joined together by a sealant while maintaining a gap between the substrates using spacers, after which a liquid crystal material 134 is injected into the space between the active matrix substrate and the opposing substrate. A known material may be applied for the liquid crystal material 134, and a TN liquid crystal is typically used. After injecting the liquid crystal material, the injecting entrance is sealed by a resin material.

Next, a flexible printed circuit (FPC) is connected to the terminal 101 of the terminal portion. The FPC comprises a copper wiring 137 on an organic resin film 138 such as polyimide, and is connected to the input terminal 129 comprising a transparent conductive film (corresponding to reference numeral 503 of FIG. 9) by an anisotropic conductive adhesive. The anisotropic conductive adhesive comprises an adhesive 135 and particles 136, with a diameter of several tens to several hundred of $\mu$m and having a conductive surface plated by a material such as gold, which are mixed therein. The particles 136 form an electrical connection in this portion by connecting the input terminal 129 and the copper wiring 137. In addition, in order to increase the mechanical strength of this region, a resin layer 139 is formed. (FIG. 3(B))

FIG. 6 is a diagram explaining the placement of the pixel portion and the terminal portion of the active matrix substrate. A pixel portion 211 is formed on a substrate 210, gate wirings 208 and source wirings 207 are formed intersecting on the pixel portion, and the n-channel TFT 201 connected to this is formed corresponding to each pixel. The pixel electrode 127 and a storage capacitor 202 are connected to the drain side of the n-channel TFT 201, and the other terminal of the storage capacitor 202 is connected to a capacitor wiring 209. The structure of the n-channel TFT 201 and the storage capacitor 202 is the same as that of the n-channel TFT 201 and the storage capacitor 202 shown by FIG. 3(A).

An input terminal portion 205 for inputting a scanning signal is formed in one edge portion of the substrate, and is connected to a gate wiring 208 by a connection wiring 206. Further, an input terminal portion 203 for inputting an image signal is formed in the other edge portion, and is connected to a source wiring 207 by a connection wiring 204. A plurality of the gate wiring 208, the source wiring 207, and the capacitor wiring 209 are formed in accordance with the pixel density. The number of the wirings is as stated above. Furthermore, an input terminal portion 212 for inputting an image signal and a connection wiring 213 may be formed, and may be connected to the source wiring alternately with the input terminal portion 203. An arbitrary number of the input terminal portions 203, 205, and 212 are formed, which may be suitably determined by the operator.

EMBODIMENT 2

FIG. 7 is an example of a method of mounting a liquid crystal display device. The liquid crystal display device has an input terminal portion 302 formed in an edge portion of a substrate 301 on which TFTs are formed, and as shown by embodiment 1, this is formed by a terminal 303 comprising the same material as the gate wiring. An opposing substrate 304 is joined to the substrate 301 by a sealant 305 encapsulating spacers 306, and in addition, polarizing plates 307 and 308 are formed. This is then fixed to a casing 321 by spacers 322.

Note that the TFT obtained in Embodiment 1 having an active layer formed by an amorphous semiconductor film has a low electric field effect mobility, and only approximately 1 cm$^2$/Vsec is obtained. Therefore, a driver circuit for performing image display is formed by a LSI chip, and mounted by a TAB (tape automated bonding) method or by a COG (chip on glass) method. In the present embodiment, an example is shown of forming the driver circuit in a LSI chip 313, and mounting by using the TAB method. A flexible printed circuit (FPC) is used, and the FPC is formed by a copper wiring 310 on an organic resin film 309, such as polyimide, and is connected to the input terminal 302 by an anisotropic conductive adhesive. The input terminal is a transparent conductive film formed on and contacting the wiring 303. The anisotropic conductive adhesive is structured by an adhesive 311 and particles 312, with a diameter of several tens to several hundred of $\mu$m and having a conductive surface plated by a material such as gold, which are mixed therein. The particles 312 form an electrical connection in this portion by connecting the input terminal 302 and the copper wiring 310. In addition, in order to increase the mechanical strength of this region, a resin layer 318 is formed.

The LSI chip 313 is connected to the copper wiring 310 by a bump 314, and is sealed by a resin material 315. The copper wiring 310 is then connected to a printed substrate 317 on which other circuits such as a signal processing circuit, an amplifying circuit, and a power supply circuit are formed, through a connecting terminal 316. A light source 319 and a light conductor 320 are formed on the opposing substrate 304 and used as a back light in the transmitting liquid crystal display device.

EMBODIMENT 3

In the present embodiment, an example of forming a protecting film is shown in FIG. 6. Note that the present embodiment is identical to Embodiment 1 till the state of FIG. 2(D), and therefore only points of difference are explained. Further, the same symbols are used for locations corresponding to those in FIG. 2(D).

After first forming through the state of FIG. 2(D) in accordance with Embodiment 1, a thin inorganic insulating film is formed on the entire surface. An inorganic insulating film formed as the thin inorganic insulating film using a silicon oxide film, a silicon nitride film, a silicon oxynitride film, or a tantalum oxide film, and a single layer or a lamination structure comprising these materials may be formed.

A forth photolithography process is performed next, forming a resist mask, and unnecessary portions are removed by etching, forming an insulating film 402 in the pixel TFT portion, and an inorganic insulating film 401 in the terminal portion. These inorganic insulating films 401 and 402 function as passivation films. Further, the thin inorganic insulating film 401 is removed in the terminal portion by the fourth photolithography process, exposing the terminal 101 of the terminal portion.

The reversed stagger type n-channel type TFT and the storage capacitor, protected by the inorganic insulating film, can thus be completed in the present embodiment by performing the photolithography process using four photomasks four times in total. Thus the pixel portion is structured by arranging these into a matrix state corresponding to each pixel, and one substrate for manufacturing the active matrix liquid crystal display device can be made.

Note that it is possible to freely combine the constitution of the present embodiment with that of Embodiment 1 or Embodiment 2.

EMBODIMENT 4

Although Embodiment 1 show an example of laminating an insulating film, an amorphous semiconductor film, an amorphous semiconductor film containing an impurity element which imparts n-type conductivity, and a metal film by sputtering, but the present embodiment shows an example of using plasma CVD to form the films.

The insulating film, the amorphous semiconductor film, and the amorphous semiconductor film containing an impurity element which imparts n-type conductivity are formed by plasma CVD in the present embodiment.

In the present embodiment, a silicon oxynitride film is used as the insulating film, and formed with a thickness of 150 nm by plasma CVD. Plasma CVD may be performed at this point with a power supply frequency of 13 to 70 MHz, preferably between 27 and 60 MHz. By using a power supply frequency of 27 to 60 MHz, a dense insulating film can be formed, and the voltage resistance can be increased as a gate insulating film. Further, a silicon oxynitride film manufactured by adding $O_2$ to $SiH_4$ and $N_2O$ has a reduction in fixed electric charge density in the film, and therefore is a material which is preferable for this use. Of course, the gate insulating film is not limited to this type of silicon oxynitride film, and a single layer or a lamination structure using other insulating films such as s silicon oxide film, a silicon nitride film, or a tantalum oxide film may be formed. Further, a lamination structure of a silicon nitride film in a lower layer, and a silicon oxide film in an upper layer may be used.

For example, when using a silicon oxide film, it can be formed by plasma CVD using a mixture of tetraethyl orthosilicate (TEOS) and $O_2$, with the reaction pressure set to 40 Pa, a substrate temperature of 250 to 350° C., and discharge at a high frequency (13.56 MHz) power density of 0.5 to 0.8 $W/cm^2$. Good characteristics as the gate insulating film can be obtained for the silicon oxide film thus formed by a subsequent thermal anneal at 300 to 400° C.

Typically, a hydrogenated amorphous silicon (a-Si:H) film is formed with a thickness of 100 nm by plasma CVD as the amorphous semiconductor film. At this point, plasma CVD may be performed with a power supply frequency of 13 to 70 MHz, preferably between 27 and 60 MHz, in the plasma CVD apparatus. By using a power frequency of 27 to 60 MHz, it becomes possible to increase the film deposition speed, and the deposited film is preferable because it becomes an a-Si film having a low defect density. In addition, it is also possible to apply a microcrystalline semiconductor film and a compound semiconductor film having an amorphous structure, such as an amorphous silicon germanium film, as the amorphous semiconductor film.

Further, if 100 to 100 k Hz pulse modulation discharge is performed in the plasma CVD film deposition of the insulating film and the amorphous semiconductor film, then particle generation due to the plasma CVD gas phase reaction can be prevented, and pinhole generation in the formed film can also be prevented, and therefore is preferable.

Further, in the present embodiment, an amorphous semiconductor film containing an impurity element which imparts n-type conductivity is formed with a thickness of 20 to 80 nm as a semiconductor film containing a single conductivity type impurity element. For example, an a-Si:H film having n-type may be formed, and in order to do so, phosphine ($PH_3$) is added at a 0.1 to 5% concentration to silane ($SiH_4$). Alternatively, a hydrogenated microcrystalline silicon film ($\mu$c-Si:H) may also be used as a substitute for the amorphous semiconductor film 106, containing an impurity element which imparts n-type conductivity.

These films can be formed in succession by appropriately changing the reaction gas. Further, these films can be laminated successively without exposure to the atmosphere at this time by using the same reaction chamber or a plurality of reaction chambers in the plasma CVD apparatus. By thus depositing successively these films without exposing the films to the atmosphere, the mixing in of impurities into the first amorphous semiconductor film can be prevented.

Note that it is possible to combine the present embodiment with Embodiment 2.

EMBODIMENT 5

Examples are shown in Embodiment 1 and Embodiment 4 of laminating an insulating film, an amorphous semiconductor film, an $n^+$a-Si film, and a metal film, in order and in succession. An example of an apparatus having a plurality of chambers, and used for cases of performing this type of successive film deposition is shown in FIG. 10.

An outline of an apparatus (successive film deposition system), shown by the present embodiment, is shown in FIG. 10 as seen from above. Reference numerals 10 to 15 in FIG. 10 denote chambers having airtight characteristics. A vacuum evacuation pump and an inert gas introduction system are arranged in each of the chambers.

The chambers denoted by reference numerals 10 and 15 are load-lock chambers for bringing sample (processing substrate) 30 into the system. The chamber denoted by reference numeral 11 is a first chamber for deposition of the insulating film 104. The chamber denoted by reference numeral 12 is a second chamber for deposition of the amorphous semiconductor film 105. The chamber denoted by reference numeral 13 is a third chamber for deposition of the amorphous semiconductor film 106 which imparts n-type conductivity. The chamber denoted by reference numeral 14 is a fourth chamber for deposition of the metal film 107. Further, reference numeral 20 denotes a common chamber for the sample, arranged in common with respect to each chamber.

An example of operation is shown below.

After pulling an initial high vacuum state in all of the chambers at first, a purge state (normal pressure) is made by using an inert gas, nitrogen here. Furthermore, all gate valves 22 to 27 are closed.

First, a cassette 28 loaded with a multiple number of processing substrate is placed into the load-lock chamber 10. After the cassette is placed inside, a door of the load-lock chamber (not shown in the figure) is closed. In this state, the gate valve 22 is opened and one of the processing substrate 30 is removed from the cassette, and is taken out to the common chamber 20 by a robot arm 21. Position alignment is performed in the common chamber at this time. Note that a substrate on which the wirings 101, 102, and 103 are formed, in accordance with Embodiment 1, is used for the substrate 30.

The gate valve 22 is then closed, and a gate valve 23 is opened next. The processing substrate 30 is then moved into the first chamber 11. Film deposition processing is performed within the first chamber at a temperature of 150 to 300° C., and the insulating film 104 is obtained. Note that a film such as a silicon nitride film, a silicon oxide film, a silicon oxynitride film, or a lamination film of these films, can be used as the insulating film. A single layer silicon nitride film is employed in the present embodiment, but a two-layer, three-layer, or higher layer lamination structure film may also be used. Note that a chamber capable of plasma CVD is used here, but is a chamber which is capable of sputtering by utilizing a target may also be used.

After completing the deposition of the insulating film, the processing substrate is pulled out into the common chamber by the robot arm, and is then transported to the second chamber 12. Film deposition is performed within the second chamber at a temperature of 150 to 300° C., similar to that of the first chamber, and the amorphous semiconductor film 105 is obtained by plasma CVD. Note that a film such as a microcrystalline semiconductor film, an amorphous germanium film, an amorphous silicon germanium film, or a lamination film of these films, etc., can be used as the amorphous semiconductor film. Further, a heat treatment process for reducing the concentration of hydrogen may be omitted with a formation temperature of 350 to 500° C. for the amorphous semiconductor film. Note that a chamber capable of plasma CVD is used here, but a chamber which is capable of sputtering by use of a target may also be used.

After completing deposition of the amorphous semiconductor film, the processing substrate is pulled out into the common chamber and then transported to the third chamber 13. Film deposition process is performed within the third chamber at a temperature of 150 to 300° C., similar to that of the second chamber, and the amorphous semiconductor film 106, containing an impurity element which imparts n-type conductivity (P or As), is obtained by plasma CVD. Note that a chamber capable of plasma CVD is used here, but a chamber which is capable of sputtering by use of a target may also be used.

After completing deposition of the amorphous semiconductor film containing an impurity element which imparts n-type conductivity, the processing substrate is pulled out into the common chamber, and then is transported to the fourth chamber 14. The metal film 107 is obtained within the fourth chamber by sputtering using a metallic target.

The processed substrate, on which four layers have thus been formed in succession, is then transported to the load-lock chamber 15 by the robot arm, and is contained in a cassette 29.

Note that the apparatus shown in FIG. 10 is only one example. Further, it is possible to freely combine the present embodiment with any one of Embodiments 1 to 4.

EMBODIMENT 6

In Embodiment 5, an example of successive lamination using a plurality of chambers is shown, but in the present embodiment, a method of successive lamination within one chamber maintained at high vacuum using the apparatus shown in FIG. 11 is employed.

The apparatus system shown in FIG. 11 is used in the present embodiment. In FIG. 11, reference numeral 40 denotes a processing substrate, reference numeral 50 denotes a common chamber, 44 and 46 denote load-lock chambers, 45 denotes a chamber, and reference numerals 42 and 43 denote cassettes. In order to prevent contamination developing during transport of the substrate, lamination is performed in the same chamber in the present embodiment.

It is possible to freely combine the present embodiment with any one of Embodiments 1 to 4.

Note that, when it is applied to Embodiment 1, a plurality of targets are prepared in the chamber 45, and then the insulating film 104, the amorphous semiconductor film 105, the amorphous semiconductor film 106 containing an impurity element which imparts n-type conductivity, and the metal film 107 may be laminated by changing the reaction gas in order.

Further, when applied to Embodiment 3, the insulating film 104, the amorphous semiconductor film 105, and the amorphous semiconductor film 106 containing an impurity element which imparts n-type conductivity, may be laminated by changing the reaction gas in order.

EMBODIMENT 7

In Embodiment 1, an example of forming the $n^+$a-Si film by using sputtering is shown, but in the present embodiment, an example of forming it by using plasma CVD is shown. Note that, except for the method of forming the $n^+$a-Si film, the present embodiment is identical to Embodiment 1, and therefore only differing points are stated below.

If phosphine ($PH_3$) is added at a concentration of 0.1 to 5% with respect to silane ($SiH_4$) as a reaction gas using plasma CVD, then the $n^+$a-Si film can be obtained.

EMBODIMENT 8

In Embodiment 7, an example of forming the $n^+$a-Si film by using plasma CVD is shown, and in the present embodiment, an example of using a microcrystalline semiconductor film containing an impurity element which imparts n-type conductivity y is shown.

By setting the deposition temperature from 80 to 300° C., preferably between 140 and 200° C., taking a gas mixture of silane diluted by hydrogen ($SiH_4:H_2=1:10$ to 100) and phosphine ($PH_3$) as the reaction gas, setting the gas pressure from 0.1 to 10 Torr, and setting the discharge power from 10 to 300 mW/cm$^2$, a microcrystalline silicon film can be obtained. Further phosphorous may be added by plasma doping after film deposition of this microcrystalline silicon film.

EMBODIMENT 9

FIG. 12 is a diagram which schematically shows a state of constructing an liquid crystal display device by using the COG method. A pixel region 803, an external input-output terminal 804, and a connection wiring 805 are formed on a first substrate. Regions surrounded by dotted lines denote a region 801 for attaching a scanning line side IC chip, and a region 802 for attaching a data line side IC chip. An opposing electrode 809 is formed on a second substrate 808, and this is joined to the first substrate 800 by using a sealing material 810. A liquid crystal layer 811 is formed inside the sealing material 810 by injecting a liquid crystal. The first substrate and the second substrate are joined with a predetermined gap, and this is set from 3 to 8 μm for a nematic liquid crystal, and from 1 to 4 μm for a smectic liquid crystal.

IC chips 806 and 807 have circuit structures which differ between the data line side and the scanning line side. The IC chips are mounted on the first substrate. An FPC (flexible printed circuit) 812 is attached to the external input-output terminal 804 in order to input power supply and control signals from the outside. In order to increase the adhesion strength of the FPC 812, a reinforcement 813 may be formed. The liquid crystal display device can thus be completed. If an electrical inspection is performed before mounting the IC chips on the first substrate, then the final process yield of the liquid crystal display device can be improved, and the reliability can be increased.

Further, a method such as a method of connection using an anisotropic conductive material or a wire bonding method, can be employed as the method of mounting the IC chips on the first substrate. FIG. 13 shows examples of such. FIG. 13(A) shows an example in which an IC chip 908 is mounted on a first substrate 901 using an anisotropic conductive material. A pixel region 902, a lead wire 906, a connection wiring and an input-output terminal 907 are formed on the first substrate 901. A second substrate is bonded to the first substrate 901 by using a sealing material 904, and a liquid crystal layer 905 is formed therebetween.

Further, an FPC 912 is bonded to one edge of the connection wiring and the input-output terminal 907 by using an anisotropic conductive material. The anisotropic conductive material comprises a resin 915 and conductive particles 914 having a diameter of several tens to several hundred of μm and plated by a material such as Au, and the connection wiring 913 formed with the FPC 912, and the connection wiring and the input-output terminal 907 are electrically connected by the conductive particles is 914. The IC chip 908 is also similarly bonded to the first substrate by an anisotropic conductive material. An input-output terminal 909 provided with the IC chip 908 and the lead wire 906 or a connection wiring and the input-output terminal 907 are electrically connected by conductive particles 910 mixed into a resin 911.

Furthermore, as shown by FIG. 13(B), the IC chip may be fixed to the first substrate by an adhesive material 916, and an input-output terminal of a stick driver and a lead wire or a connection wiring may be connected by an Au wire 917. Then, this is all sealed by a resin 918.

The method of mounting the IC chip is not limited to the method based on FIGS. 12 and 13, and it is also possible to use a known method not explained here, such as a COG method, a wire bonding method or a TAB method.

It is possible to freely combine the present embodiment with Embodiment 1.

EMBODIMENT 10

In Embodiment 1, a method of manufacturing an active matrix substrate corresponding to a transmission type liquid crystal display device is shown, but in the present embodiment, an example of application to a reflection type liquid crystal display device is shown, using FIG. 14.

First, in the same way as the embodiment 1, steps up to the step shown in FIG. 2(B) are carried out. Then, an interlayer insulating film comprising an organic resin film is formed. Next, a roughening process of the interlayer insulating film is carried out to form an interlayer insulating film 601 having a roughened portion. As the roughening process, a method of applying an organic resin film containing fibers or spacers may be used, a method of formation by partially etching an organic resin film by using a mask may be used, or a method of formation by heating to perform reflow after a photosensitive resin is etched by using a mask to make a cylindrical shape, may be used.

Next, contact holes reaching a source wiring line and a drain electrode are formed in the interlayer insulating film 601 by a third photolithography step. Besides, in order to form a storage capacitor by the same step, at the same time that the contact hole reaching the electrode is formed, the interlayer insulating film on a terminal portion is removed.

Next, a conductive film (Al, Ag, etc.) having reflectivity is formed.

Then, a resist mask pattern is formed by a fourth photolithography step, and a pixel electrode 602 made of the conductive film having the reflectivity is formed by etching. The pixel electrode 602 formed in this way has a roughened portion, can disperse light, and can prevent formation of a mirror surface. At the same time, a lead wiring line 603 reaching a source electrode is formed.

Since subsequent steps are the same as the embodiment 1, they are omitted. In this way, an active matrix substrate corresponding to a reflection type liquid crystal display device can be fabricated through four photolithography steps using four photomasks.

Besides, the present embodiment can be combined with the embodiment 2 or the embodiment 3.

EMBODIMENT 11

CMOS circuits and pixel portion formed by implementing the present invention can be used in various electro-optical devices (such as an active matrix liquid crystal display device and an active matrix EC display device). Namely, the present invention can be implemented in all electronic appliance in which these electro-optical devices are built into a display portion.

The following can be given as such electronic appliance: a video camera, a digital camera, a projector (rear type or front type), a head-mounted display (goggle type display), a car navigation system, a car stereo, a personal computer, and a portable information terminal (such as a mobile computer, a portable telephone or an electronic book). Examples of these are shown in FIGS. 15, 16 and 17.

FIG. 15(A) is a personal computer, and it includes a main body 2001, an image input portion 2002, a display portion 2003, and a keyboard 2004, etc. The present invention can be applied to the image input portion 2002, the display portion 2003 or other signal driver circuits.

FIG. 15(B) is a video camera, and it includes a main body 2101, a display portion 2102, an audio input portion 2103, operation switches 2104, a battery 2105, and an image receiving portion 2106, etc. The present invention can be applied to the display portion 2102 or other signal driver circuits.

FIG. 15(C) is a mobile computer, and it includes a main body 2201, a camera portion 2202, an image receiving portion 2203, operation switches 2204, and a display portion 2205, etc. The present invention can be applied to the display portion 2205 or other signal driver circuits.

FIG. 15(D) is a goggle type display, and it includes a main body 2301, a display portion 2302, an arm portion 2303, etc. The present invention can be applied to the display portion 2302 or other signal driver circuits.

FIG. 15(E) is a player that uses a recording medium on which a program is recorded (hereafter referred to as a recording medium), and the player includes a main body 2401, a display portion 2402, a speaker portion 2403, a recording medium 2404, and operation switches 2405, etc. Note that this player uses a recording medium such as a DVD (digital versatile disk) or a CD, and the appreciation of music, the appreciation of film, game playing and the Internet can be performed. The present invention can be applied to the display portion 2402 or other signal driver circuits.

FIG. 15(F) is a digital camera, and it includes a main body 2501, a display portion 2502, an eyepiece portion 2503, operation switches 2504, and an image receiving portion (not shown in the figure), etc. The present invention can be applied to the display portion 2502 or other signal driver circuits.

FIG. 16(A) is a front projector, and it includes a projection system 2601, a screen 2602, etc. The present invention can be applied to a liquid crystal display device 2808 which constitutes a part of the projection system 2601, or other signal driver circuits.

FIG. 16(B) is a rear projector, and it includes a main body 2701, a projection system 2702, a mirror 2703, a screen 2704, etc. The present invention can be applied to a liquid crystal display device 2808 which constitutes apart of the projection system 2702 or other signal driver circuits.

Note that FIG. 16(C) is a diagram showing an example of the structure of projection systems 2601 and 2702 of FIGS. 16(A) and 16(B). The projection systems 2601 and 2702 comprise an optical light source system 2801, mirrors 2802 and 2804 to 2806, a dichroic mirror 2803, a prism 2807, a liquid crystal display device 2808, phase differentiating plate 2809 and a projection optical system 2810. The projection optical system 2810 comprises an optical system including a projection lens. The present Embodiment showed a three plate type, but it is not limited to this structure, and it may be for instance a single plate type. Further, the operator may appropriately dispose an optical system such as an optical lens, a film having light polarizing function, a film for adjusting phase difference and an IR film, in the optical path shown by an arrow in the FIG. 16(C).

FIG. 16(D) is a diagram showing an example of the structure of the optical light source system 2801 of FIG. 16(C). In the present embodiment the optical light source system 2801 comprises a reflector 2811, a light source 2812, lens arrays 2813 and 2814, light polarizing conversion element 2815 and a condenser lens 2816. Note that the optical light source system shown in FIG. 16(D) is merely an example and is not specifically limited. For example, the operator may appropriately dispose an optical system such as an optical lens, a film having light polarizing function, a film for adjusting phase difference and an IR film, etc., in the optical light source system.

Provided however, the projectors shown in FIG. 16 show a case of using transmission type electro-optical device and an application example of reflection type electro-optical device is not shown in the figures.

FIG. 17(A) is a portable telephone, and it includes a main body 2901, an audio output portion 2902, an audio input portion 2903, a display portion 2904, operation switches 2905, and an antenna 2906, etc. The present invention can be applied to the audio output portion 2902, the audio input portion 2903, the display portion 2904 or other signal driver circuits.

FIG. 17(B) is a portable book (electronic book), and it includes a main body 3001, display portions 3002 and 3003, a recording medium 3004, operation switches 3005, and an antenna 3006, etc. The present invention can be applied to the display portions 3002 and 3003 or other signal driver circuits.

FIG. 17(C) is a display, and it includes a main body 3101, a support stand 3102, and a display portion 3103, etc. The present invention can be applied to the display portion 3103. The display of the present invention is advantageous for a large size screen in particular, and is advantageous for a display equal to or greater than 10 inches (especially equal to or greater than 30 inches) in diagonal.

The applicable range of the present invention is thus extremely wide, and it is possible to apply the present invention to electronic appliance in all fields. Further, the electronic appliance of the present embodiment can be realized by using a constitution of any combination of embodiments 1 to 10.

Effects of the Invention

With the present invention, a liquid crystal display device prepared with a pixel TFT portion, having a reversed stagger type n-channel TFT, and a storage capacitor can be realized through three photolithography steps using three photomasks.

Further, when forming a protecting film, a liquid crystal display device prepared with a pixel TFT portion, having a reversed stagger type n-channel TFT protected by an inorganic insulating film, and a storage capacitor can be realized through four photolithography steps using four photomasks.

What is claimed is:

1. A method of fabricating a semiconductor device, comprising the steps of:

forming a gate wiring line by using a first mask;

forming an insulating film covering the gate wiring line;

forming a first amorphous semiconductor film on the insulating film;

forming a second amorphous semiconductor film containing an impurity element to give an n-type conductivity on the first amorphous semiconductor film;

forming a first conductive film on the second amorphous semiconductor film;

forming a source wiring line and an electrode by selectively removing the insulating film, the first amorphous semiconductor film, the second amorphous semiconductor film, and the first conductive film by using a second mask;

forming a second conductive film being in contact with and overlapping with the source wiring line and the electrode; and forming a source region and a drain region comprising the second amorphous semiconductor film, and a pixel electrode made of the second conductive film by selectively removing a part of the first amorphous semiconductor film, the second amorphous semiconductor film, the first conductive film, and the second conductive film by using a third mask.

2. A method according to claim 1, wherein said steps of forming said insulating film, forming said first amorphous semiconductor film, forming said second amorphous semiconductor film, and forming said first conductive film are performed in succession, without exposure to the atmosphere.

3. A method according to claim 1, wherein said insulating film is formed by a sputtering method.

4. A method according to claim 1, wherein said first amorphous semiconductor film is formed by a sputtering method.

5. A method according to claim 1, wherein said second amorphous semiconductor film is formed by a sputtering method.

6. A method according to claim 1, wherein said steps of forming said insulating film, forming said first amorphous semiconductor film, forming said second amorphous semiconductor film, and forming said first conductive film are performed in succession within the same chamber.

7. A method according to claim 1, wherein said insulating film is formed by a plasma CVD method.

8. A method according to claim 1, wherein said first amorphous semiconductor film is formed by a plasma CVD method.

9. A method according to claim 1, wherein said second amorphous semiconductor film is formed by a plasma CVD method.

10. A method according to claim 1, wherein said second conductive film is a transparent conductive film.

11. A method according to claim 1, wherein said second conductive film is a conductive film having reflective characteristics.

12. A method according to claim 1, wherein the first and second conductive films are removed by wet etching with the third mask and the first and second semiconductor films are removed by dry etching with the third mask.

13. A method according to claim 1, wherein the part of the first semiconductor film, the second semiconductor film, the first conductive film, and the second conductive film are removed by dry etching with the third mask.

14. A method according to claim 1, wherein the part of the first semiconductor film, the second semiconductor film, the first conductive film, and the second conductive film are removed by wet etching with the third mask.

15. A method according to claim 1, A method according to claim wherein said semiconductor device comprises at least one electric appliances selected from the group consisting of a video camera, a digital camera, a projector, a head-mounted display, a goggle type display, a car navigation system, a car stereo, a personal computer, a portable information terminal, a mobile computer, a portable telephone, an electronic book, and a player that uses a recording medium.

16. A method of fabricating a semiconductor device, comprising the steps of:
    forming a gate electrode over a substrate;
    forming a first semiconductor film on said gate electrode with an insulating film interposed therebetween;
    forming a second semiconductor film having an impurity element to give one conductivity on the first semiconductor film;
    forming a first conductive film on the second semiconductor film;
    patterning the insulating film, the first semiconductor film, the second semiconductor film, and the first conductive film;
    forming a second conductive film being in contact with and overlapping with remained lamination of the insulating film, the first semiconductor film, the second semiconductor film, and the first conductive film; and
    selectively removing a part of the first semiconductor film, the second semiconductor film, the first conductive film, and the second conductive film by using a same mask.

17. A method according to claim 16, wherein said first and second semiconductor film comprise amorphous silicon, respectively.

18. A method according to claim 16, wherein said insulating film, said first semiconductor film, said second semiconductor film, and said first conductive film are formed in succession, without exposure to the atmosphere.

19. A method according to claim 16, wherein said insulating film, said first semiconductor film, said second semiconductor film, and said first conductive film are formed in succession within the same chamber.

20. A method according to claim 16, wherein said insulating film is formed by a sputtering method.

21. A method according to claim 16, wherein said insulating film is formed by a plasma CVD method.

22. A method according to claim 16, wherein said second semiconductor film has an n-type impurity.

23. A method according to claim 16, wherein said second conductive film is a transparent conductive film.

24. A method according to claim 16, wherein said second conductive film is a conductive film having reflective characteristics.

25. A method according to claim 16, wherein the first and second conductive films are removed by wet etching with the third mask and the first and second semiconductor films are removed by dry etching with the third mask.

26. A method according to claim 16, wherein the part of the first semiconductor film, the second semiconductor film, the first conductive film, and the second conductive film are removed by dry etching with the third mask.

27. A method according to claim 16, wherein the part of the first semiconductor film, the second semiconductor film, the first conductive film, and the second conductive film are removed by wet etching with the third mask.

28. A method according to claim 16, A method according to claim wherein said semiconductor device comprises at least one electric appliances selected from the group consisting of a video camera, a digital camera, a projector, a head-mounted display, a goggle type display, a car navigation system, a car stereo, a personal computer, a portable information terminal, a mobile computer, a portable telephone, an electronic book, and a player that uses a recording medium.

29. A method of fabricating a semiconductor device comprising the steps of:
    forming a gate wiring line by using a first mask;
    forming an insulating film covering the gate wiring line;
    forming a first semiconductor film on the insulating film;
    forming a second semiconductor film containing an impurity element to give one conductivity on the first semiconductor film;
    forming a first conductive film on the second semiconductor film;
    patterning the insulating film, the first semiconductor film, the second semiconductor film, and the first conductive film by using a second mask;
    forming a second conductive film over at least a remained first conductive film; and
    selectively removing a part of the first semiconductor film, the second semiconductor film, the first conductive film, and the second conductive film by using a third mask.

30. A method according to claim 29, wherein said first and second semiconductor film comprise amorphous silicon, respectively.

31. A method according to claim 29, wherein said insulating film, said first semiconductor film, said second semiconductor film, and said first conductive film are formed in succession, without exposure to the atmosphere.

32. A method according to claim 29, wherein said insulating film, said first semiconductor film, said second semiconductor film, and said first conductive film are formed in succession within the same chamber.

33. A method according to claim 29, wherein said insulating film is formed by a sputtering method.

34. A method according to claim 29, wherein said insulating film is formed by a plasma CVD method.

35. A method according to claim 29, wherein said second semiconductor film has an n-type impurity.

36. A method according to claim 29, wherein said second conductive film is a transparent conductive film.

37. A method according to claim 29, wherein said second conductive film is a conductive film having reflective characteristics.

38. A method according to claim 29, wherein the first and second conductive films are removed by wet etching with the third mask and the first and second semiconductor films are removed by dry etching with the third mask.

39. A method according to claim 29, wherein the part of the first semiconductor film, the second semiconductor film, the first conductive film, and the second conductive film are removed by dry etching with the third mask.

40. A method according to claim 29, wherein the part of the first semiconductor film, the second semiconductor film, the first conductive film, and the second conductive film are removed by wet etching with the third mask.

41. A method according to claim 29, A method according to claim wherein said semiconductor device comprises at least one electric appliances selected from the group consisting of a video camera, a digital camera, a projector, a head-mounted display, a goggle type display, a car navigation system, a car stereo, a personal computer, a portable information terminal, a mobile computer, a portable telephone, an electronic book, and a player that uses a recording medium.

42. A method of fabricating a semiconductor device comprising the steps of:
forming a gate electrode by using a first mask;
forming an insulating film covering the gate electrode;
forming a first semiconductor film on the insulating film;
forming a second semiconductor film containing an impurity element to give one conductivity on the first semiconductor film;
forming a first conductive film on the second semiconductor film;
patterning the insulating film, the first semiconductor film, the second semiconductor film, and the first conductive film by using a second mask;
forming a second conductive film over a remained first conductor film; and
forming a source region and a drain region comprising the second semiconductor film, and a pixel electrode comprising the second conductive film by selectively removing a part of the first semiconductor film, the second semiconductor film, the first conductive film, and the second conductive film by using a third mask.

43. A method according to claim 42, wherein said first and second semiconductor film comprise amorphous silicon, respectively.

44. A method according to claim 42, wherein said insulating film, said first semiconductor film, said second semiconductor film, and said first conductive film are formed in succession, without exposure to the atmosphere.

45. A method according to claim 42, wherein said insulating film, said first semiconductor film, said second semiconductor film, and said first conductive film are formed in succession within the same chamber.

46. A method according to claim 42, wherein said insulating film is formed by a sputtering method.

47. A method according to claim 42, wherein said insulating film is formed by a plasma CVD method.

48. A method according to claim 42, wherein said second semiconductor film has an n-type impurity.

49. A method according to claim 42, wherein said second conductive film is a transparent conductive film.

50. A method according to claim 42, wherein said second conductive film is a conductive film having reflective characteristics.

51. A method according to claim 42, wherein the first and second conductive films are removed by wet etching with the third mask and the first and second semiconductor films are removed by dry etching with the third mask.

52. A method according to claim 42, wherein the part of the first semiconductor film, the second semiconductor film, the first conductive film, and the second conductive film are removed by dry etching with the third mask.

53. A method according to claim 42, wherein the part of the first semiconductor film, the second semiconductor film, the first conductive film, and the second conductive film are removed by wet etching with the third mask.

54. A method according to claim 42, A method according to claim wherein said semiconductor device comprises at least one electric appliances selected from the group consisting of a video camera, a digital camera, a projector, a head-mounted display, a goggle type display, a car navigation system, a car stereo, a personal computer, a portable information terminal, a mobile computer, a portable telephone, an electronic book, and a player that uses a recording medium.

55. A method of fabricating a semiconductor device, comprising the steps of:
forming a gate wiring line over a substrate by using a first mask;
forming an insulating film covering the gate wiring line;
forming a first semiconductor film on the insulating film;
forming a second semiconductor film containing an impurity element to give one conductivity on the first semiconductor film;
forming a first conductive film on the second semiconductor film;
patterning the insulating film, the first semiconductor film, the second semiconductor film, and the first conductive film by using a second mask;
forming a second conductive film covering the substrate; and
selectively removing a part of the first semiconductor film, the second semiconductor film, the first conductive film, and the second conductive film by using a third mask, thereby a pixel electrode comprising the second conductive film, source and drain electrodes comprising the first conductive film, and an input terminal comprising the second conductive film are formed.

56. A method according to claim 55, wherein the first and second conductive films are removed by wet etching with the third mask and the first and second semiconductor films are removed by dry etching with the third mask.

57. A method according to claim 55, wherein the part of the first semiconductor film, the second semiconductor film, the first conductive film, and the second conductive film are removed by dry etching with the third mask.

58. A method according to claim 55, wherein the part of the first semiconductor film, the second semiconductor film, the first conductive film, and the second conductive film are removed by wet etching with the third mask.

59. A method according to claim 55, A method according to claim wherein said semiconductor device comprises at least one electric appliances selected from the group consisting of a video camera, a digital camera, a projector, a head-mounted display, a goggle type display, a car navigation system, a car stereo, a personal computer, a portable information terminal, a mobile computer, a portable telephone, an electronic book, and a player that uses a recording medium.

* * * * *